US008598919B2

(12) United States Patent
Koyasu

(10) Patent No.: US 8,598,919 B2
(45) Date of Patent: Dec. 3, 2013

(54) SIGNAL OUTPUT CIRCUIT

(75) Inventor: Takahisa Koyasu, Chita (JP)

(73) Assignee: DENSO CORPORATION, Kariya (JP)

(*) Notice: Subject to any disclaimer, the term of this patent is extended or adjusted under 35 U.S.C. 154(b) by 464 days.

(21) Appl. No.: 12/964,358

(22) Filed: Dec. 9, 2010

(65) Prior Publication Data

US 2011/0169475 A1 Jul. 14, 2011

(30) Foreign Application Priority Data

Jan. 12, 2010 (JP) .................................... 2010-3878
Jun. 18, 2010 (JP) ................................ 2010-139306

(51) Int. Cl.
*H03K 3/00* (2006.01)

(52) U.S. Cl.
USPC ........................................................ 327/109

(58) Field of Classification Search
None
See application file for complete search history.

(56) References Cited

U.S. PATENT DOCUMENTS 5,841,297 A 11/1998 Bayer et al.
6,222,403 B1 4/2001 Mitsuda
7,683,600 B2 3/2010 Kanamaru et al.
8,134,388 B2 * 3/2012 Cortigiani et al. ............ 327/108
8,138,819 B2 * 3/2012 Kuroda ........................ 327/374
2002/0171455 A1 11/2002 Tsuchida et al.
2006/0267665 A1 11/2006 Kawamoto
2010/0244910 A1 9/2010 Kawaai et al.
2011/0169547 A1 7/2011 Suzuki et al.

FOREIGN PATENT DOCUMENTS

JP A-05-300109 11/1993
JP A-09-204230 8/1997
JP A-2006-319753 11/2006
JP A-2009-016997 1/2009
JP A-2009-021727 1/2009

OTHER PUBLICATIONS

Office Action mailed Feb. 7, 2012 in corresponding JP Application No. 2010-139306 (and English translation).

* cited by examiner

*Primary Examiner* — Lincoln Donovan
*Assistant Examiner* — Khareem E Almo
(74) *Attorney, Agent, or Firm* — Posz Law Group, PLC

(57) ABSTRACT

A MOSFET at an input side controls the operation of a current mirror circuit in accordance with a level change of a PWM signal applied to its gate. When the current mirror circuit operates, a current generated by a current source flows as a mirror current so that a current flows to discharge electricity charged in a capacitance between a gate and a source through a gate of a MOSFET at an output side. When the current mirror circuit stops its operation, a current flowing from the current mirror circuit through the current source is supplied to the gate of the MOSFET at the output side.

16 Claims, 26 Drawing Sheets

| | A | B | C | D |
|---|---|---|---|---|
| (1) | LO | LO | HI | HI |
| (2) | HI | LO | HI | HI |
| (3) | LO | HI | LO | LO |
| (4) | LO | LO | HI | LO |
| (5) | LO | HI | LO | LO |

SIGNAL OUTPUT CIRCUIT

CROSS REFERENCE TO RELATED APPLICATION

This application is based on and incorporates herein by reference Japanese patent applications No. 2010-3878 filed on Jan. 12, 2010 and No. 2010-139306 filed on Jun. 18, 2010.

FIELD OF THE INVENTION

The present invention relates to a signal output circuit, which outputs a drive control signal to a switching element connected in series with an electric load between a power source and a ground.

BACKGROUND OF THE INVENTION

An interior light, a rear light, a flasher light or the like is recently controlled to produce gradually changing brightness of light to provide fanciness as electric equipment of a vehicle or produce light of fixed brightness irrespective of changes in a power supply voltage of a battery. The brightness of a light source such as a light bulb and a light-emitting diode is controlled by driving a switching element such as a MOSFET by pulse-width modulation (PWM) control. Since the number of electric loads such as lights to be driven increases recently, radio noises, which are generated at time of driving the electric loads, increase correspondingly.

As technology for reducing radio noises generated when a PWM control is performed, as disclosed in the following patent documents 1 and 2, it is proposed to shape a waveform of a PWM signal into a trapezoid form so that a current supplied to a load changes slowly or gradually thereby suppressing noises. According to this technology, a voltage applied to a gate of a switching element such as a MOSFET changes at low levels during a period, in which a current waveform changes at a uniform rate. Since the switching element continues to have a high on-resistance during such a period, the switching element generates heat. The amount of heat thus generated increases, as the amount of a drive current increases or the number of electric loads to be driven increases. As a result, it becomes difficult to promote heat radiation. Since reduction in radio noise and suppression of heat generation are in a relation of trade-off, the radio noise reduction and the heat generation suppression need be appropriately adjusted.

Patent document 1: JP 3685108 (US 2002/0171455 A1)

Patent document 2: JP 2009-16697A

Patent document 3: JP 2007-13916A (US 2006/0267665 A1)

In patent document 1, for example, trade-off between radio noise reduction and heat generation suppression is considered. As a result, a very complicated circuit configuration is needed. In patent document 3, a waveform of a PWM signal is modified to a pseudo-sinusoidal waveform, which is more effective to reduce noise generation and suppress heat generation.

Specifically, in patent document 3, the pseudo-sinusoidal waveform is generated by sequentially switching connections of a plurality of constant current sources while monitoring a source voltage of a FET. According to this feedback control, circuit configuration need be complicated and the circuit becomes more susceptible to noises generated by other devices. If the signal waveform is smoothed by simply using a CR filter, rise of the signal waveform is smoothed but fall of the same is not smoothed.

SUMMARY OF THE INVENTION

It is therefore an object of the present invention to provide a signal output circuit, which controls a switching element by a gradually changing waveform like a sinusoidal waveform in a simple configuration.

According to the present invention, a signal output circuit is provided for outputting a drive signal to a voltage-controlled switching element, which is connected in series with a load between a power source and a ground, in accordance with a control signal inputted thereto. The signal output circuit comprises a current generation circuit, a current mirror circuit and a control part. The current generation circuit generates a current based on a relation between a potential at a control terminal of the switching element and either one of a voltage of a controlled power source and a ground potential. The current mirror circuit supplies, as a mirror current, a current generated by the current generation circuit. The control part controls an operation of the current mirror circuit in accordance with a level change of the control signal. The control part operates the current mirror circuit to supply a discharge current from the control terminal and stops an operation of the current mirror circuit to supply a charge current to the control terminal.

BRIEF DESCRIPTION OF THE DRAWINGS

The above and other objects, features and advantages of the present invention will become more apparent from the following detailed description made with reference to the accompanying drawings. In the drawings.

Figure 13:
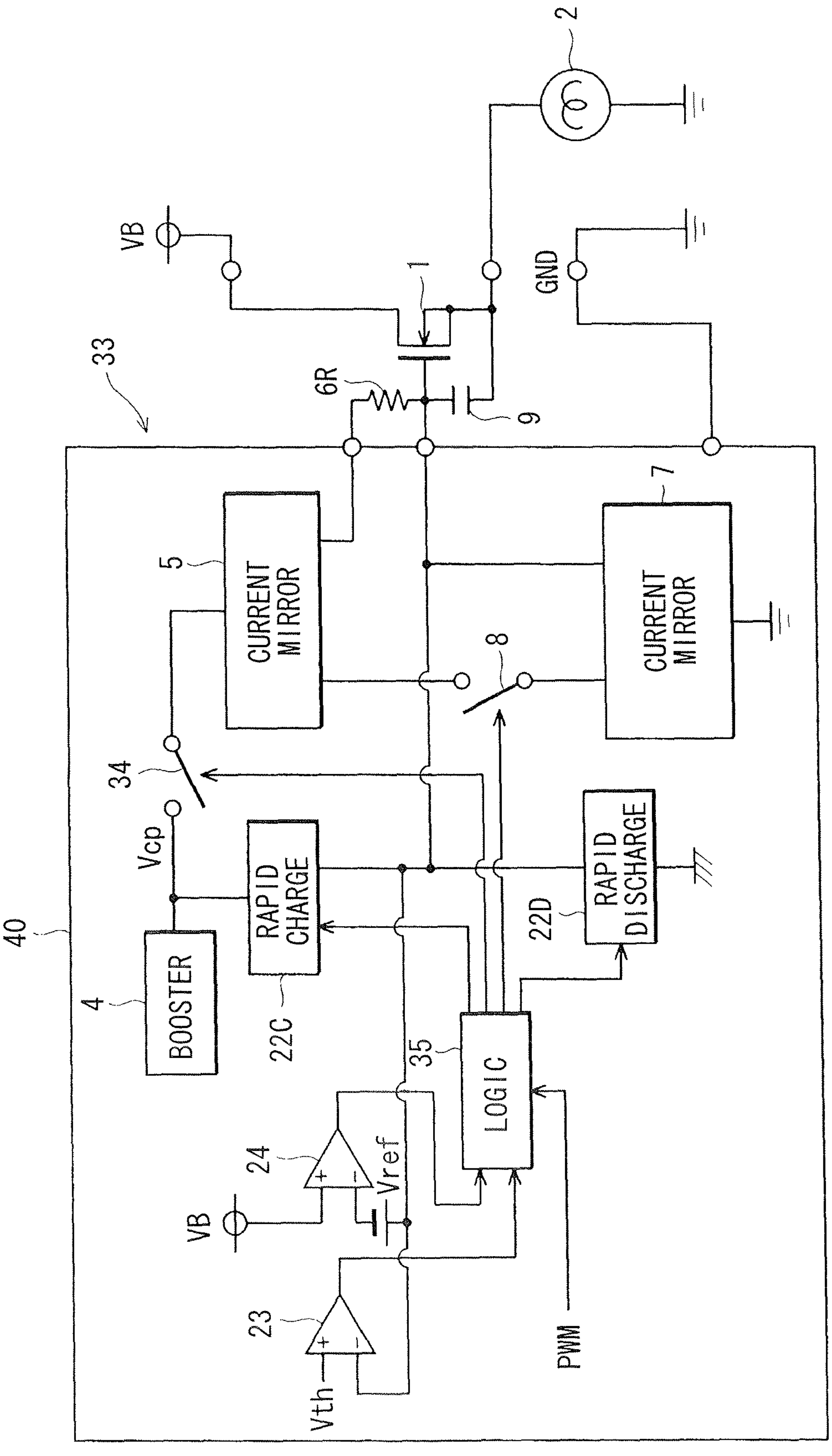
Figure 14A:
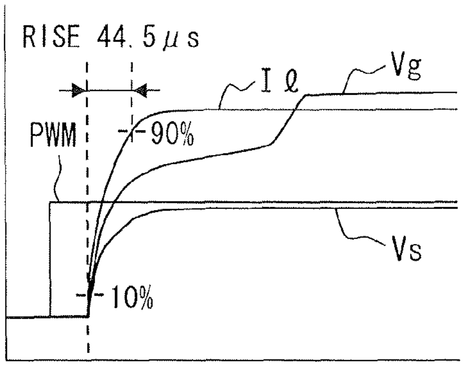
Figure 14B:
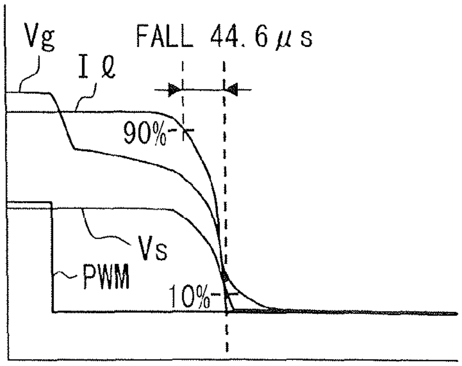
Figure 15A:
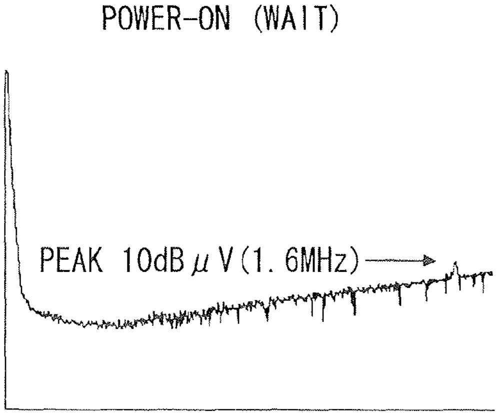
Figure 15B:
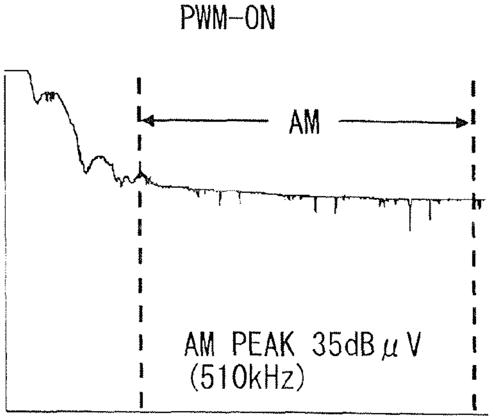
Figure 16A:
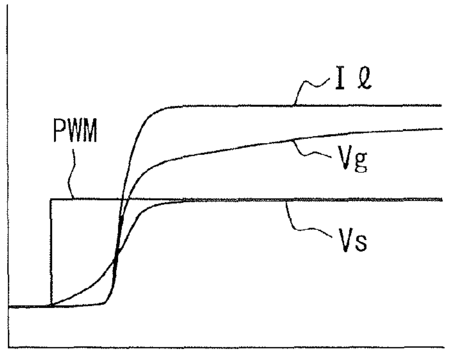
Figure 16B:
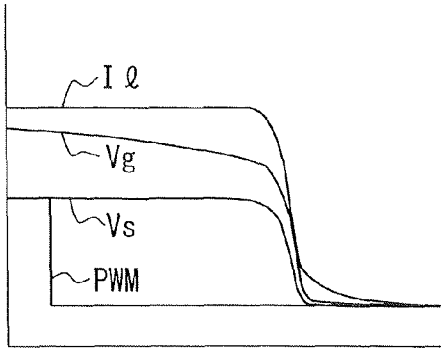
Figure 17A:
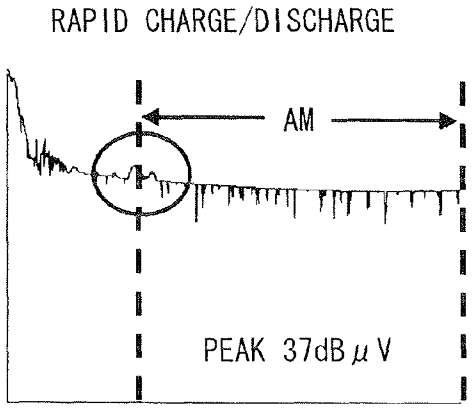
Figure 17B:
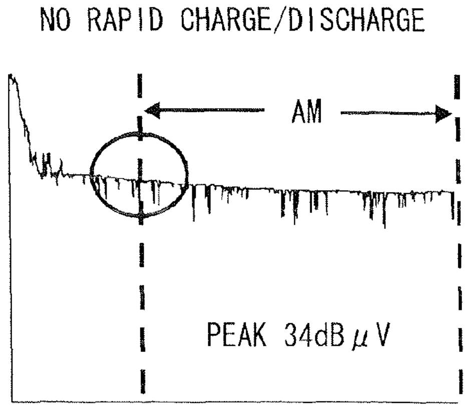
Figure 18:
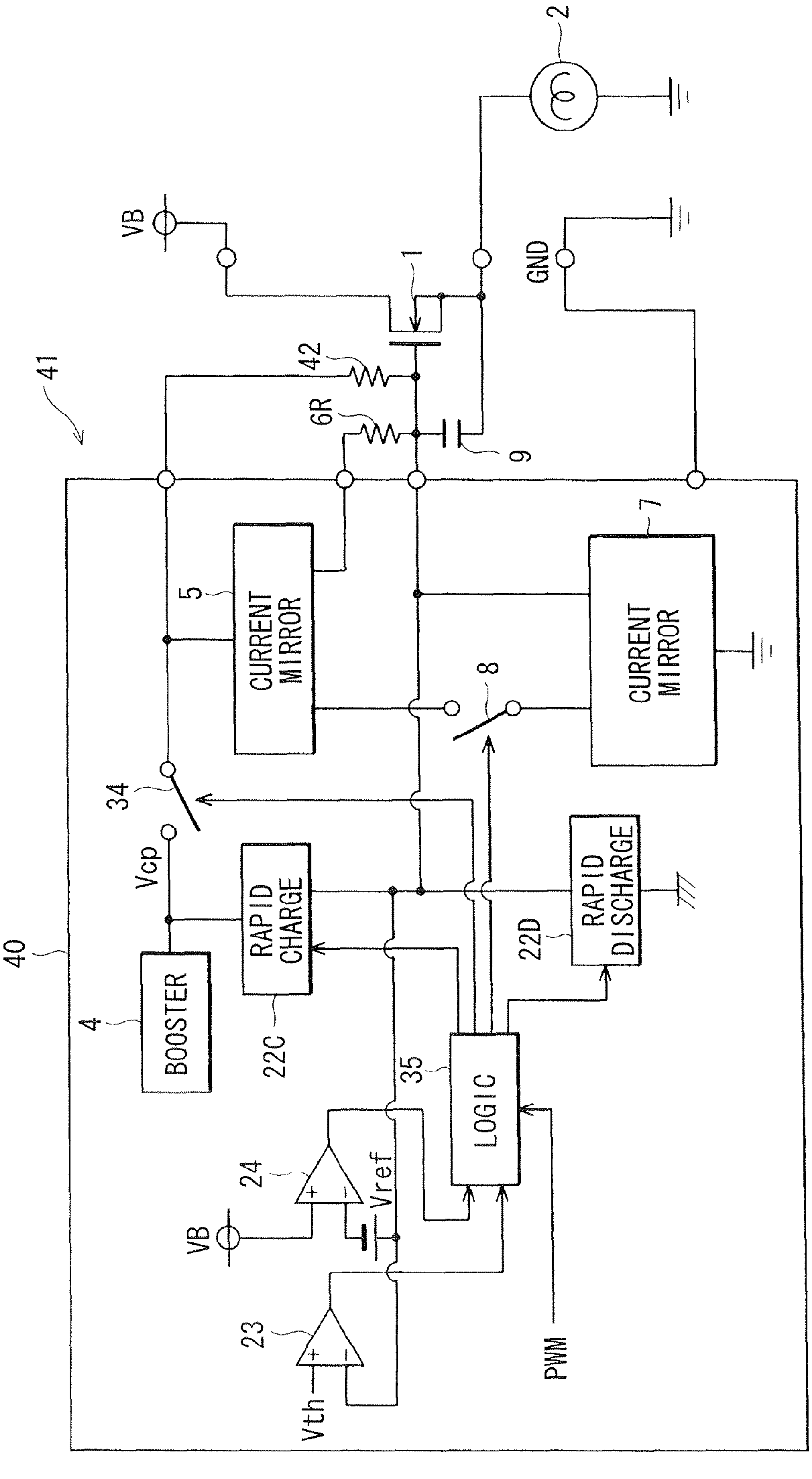
Figure 19:
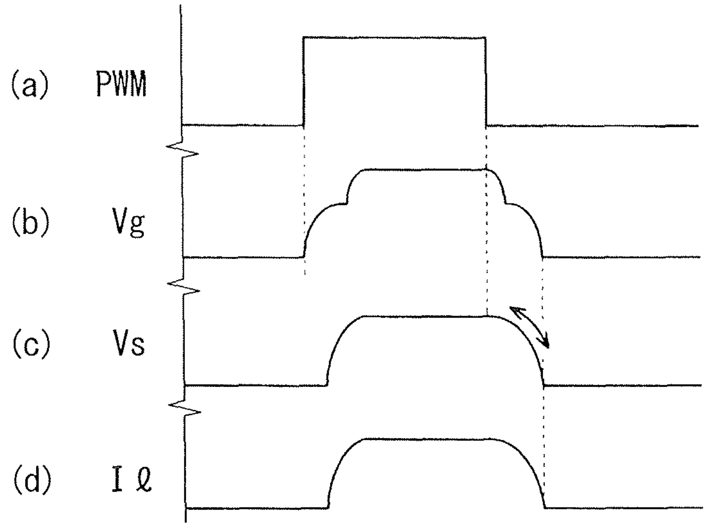
Figure 20:
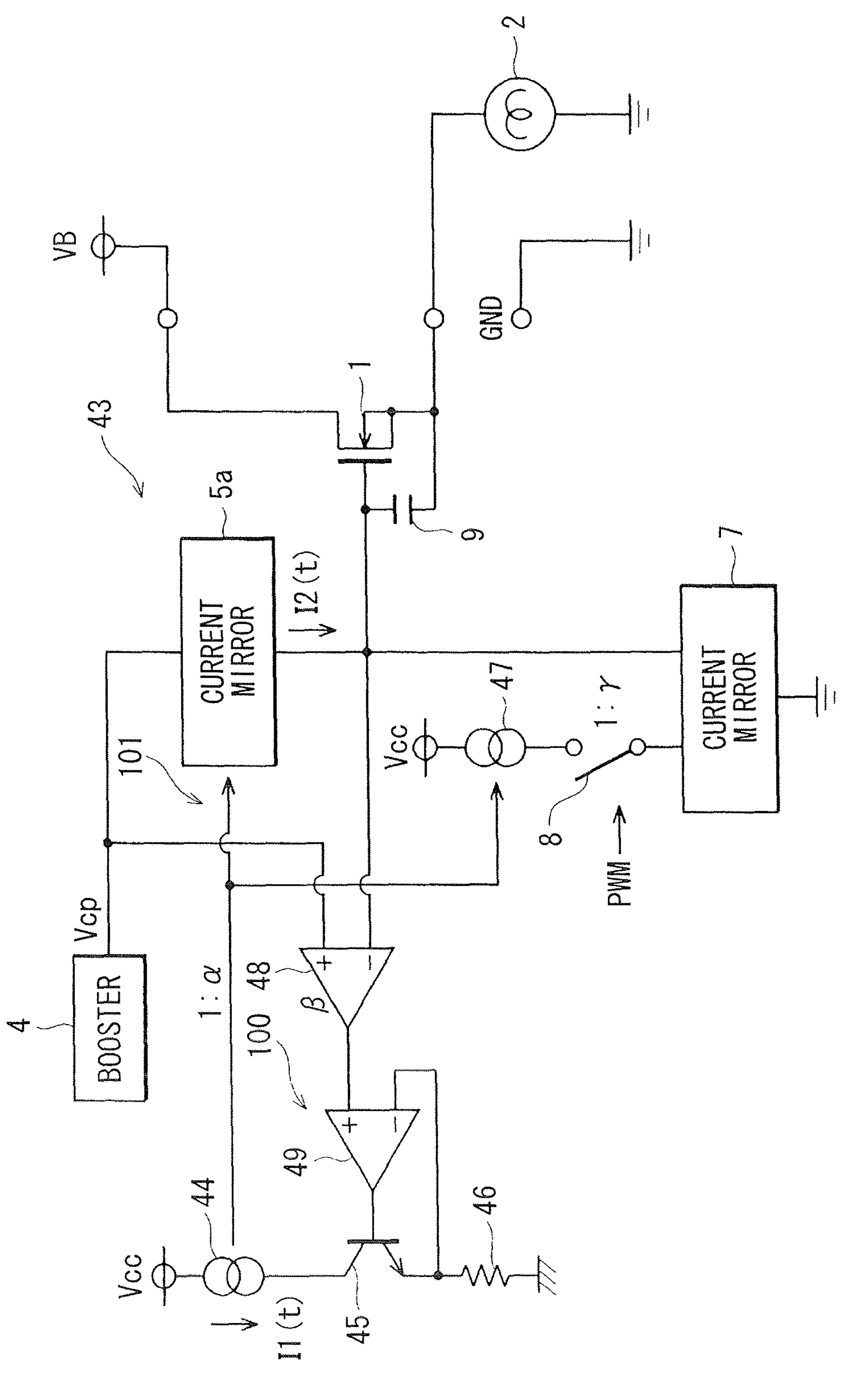
Figure 21:
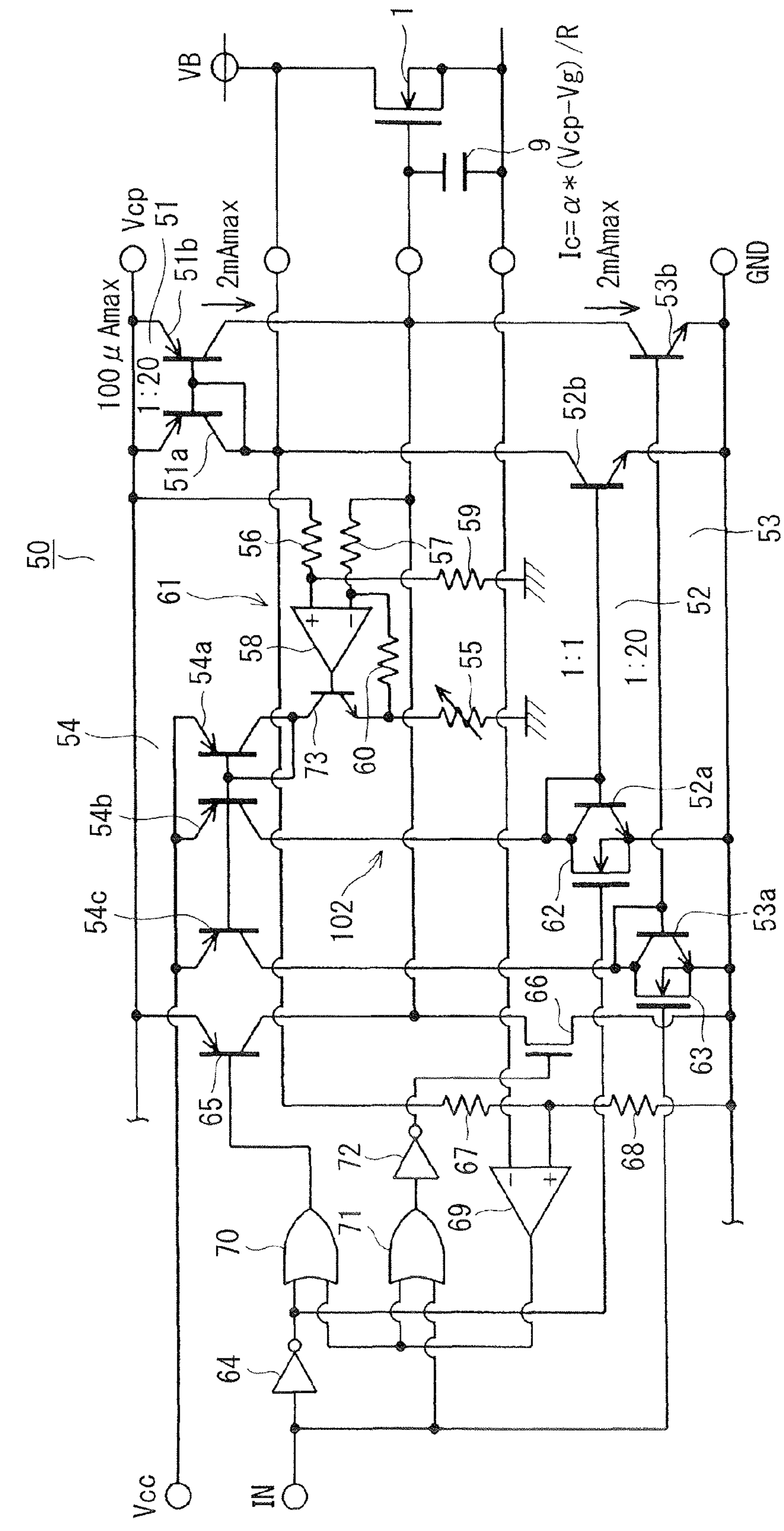
Figure 22:
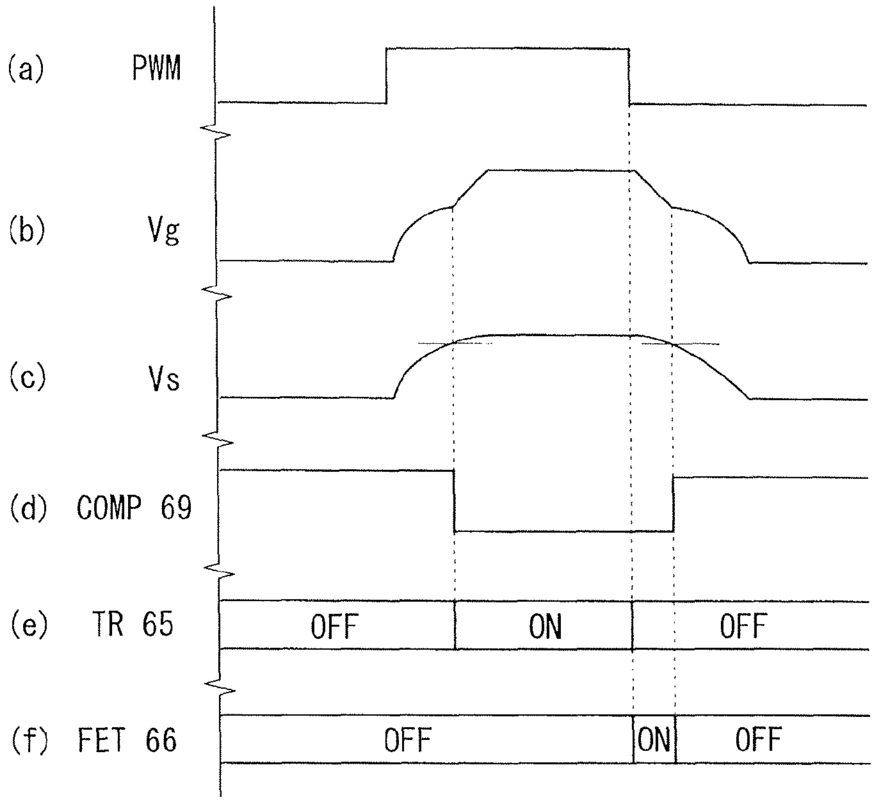
Figure 23:
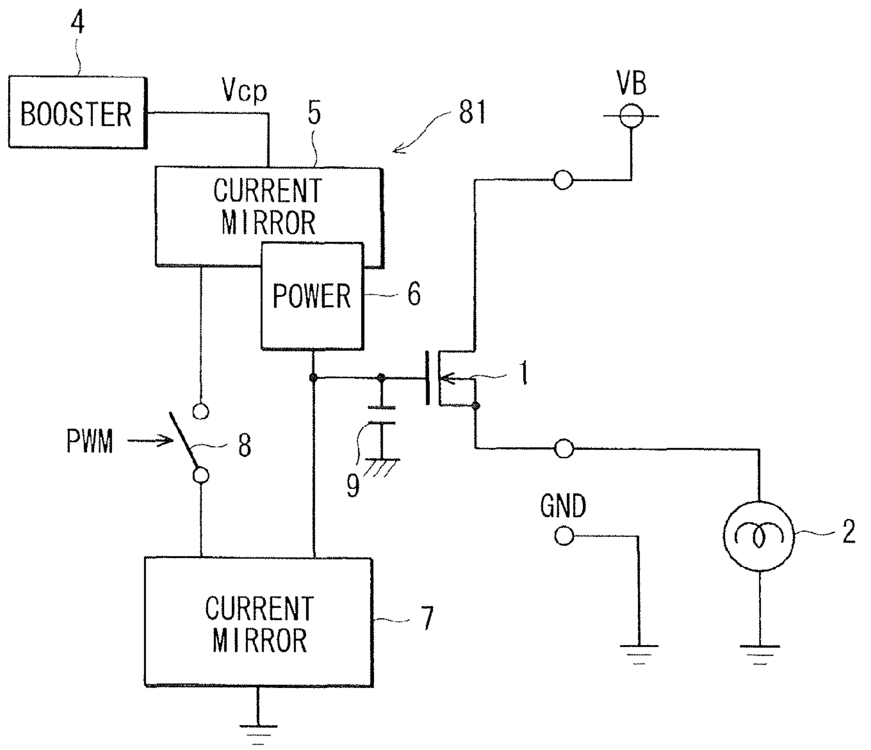
Figure 24A:
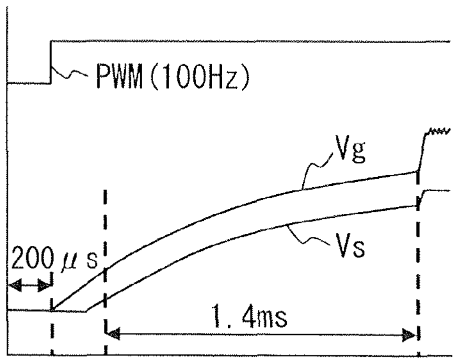
Figure 24B:
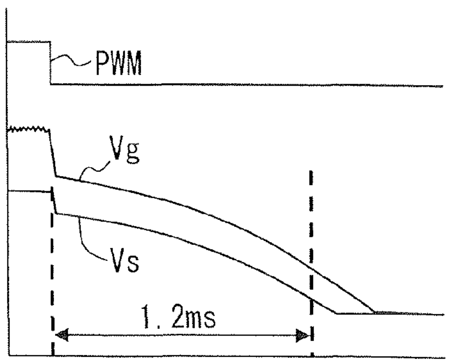
Figure 25:
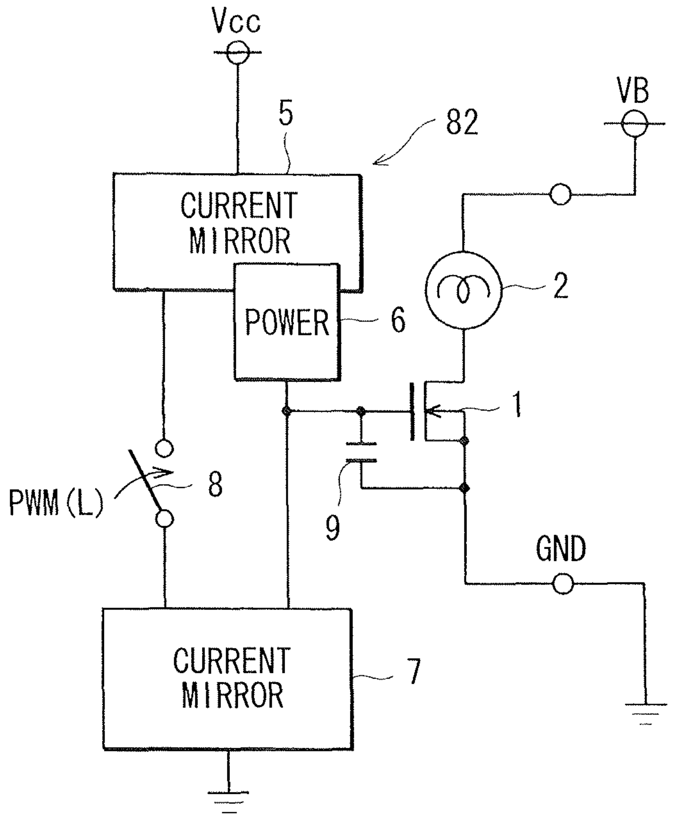
Figure 26:
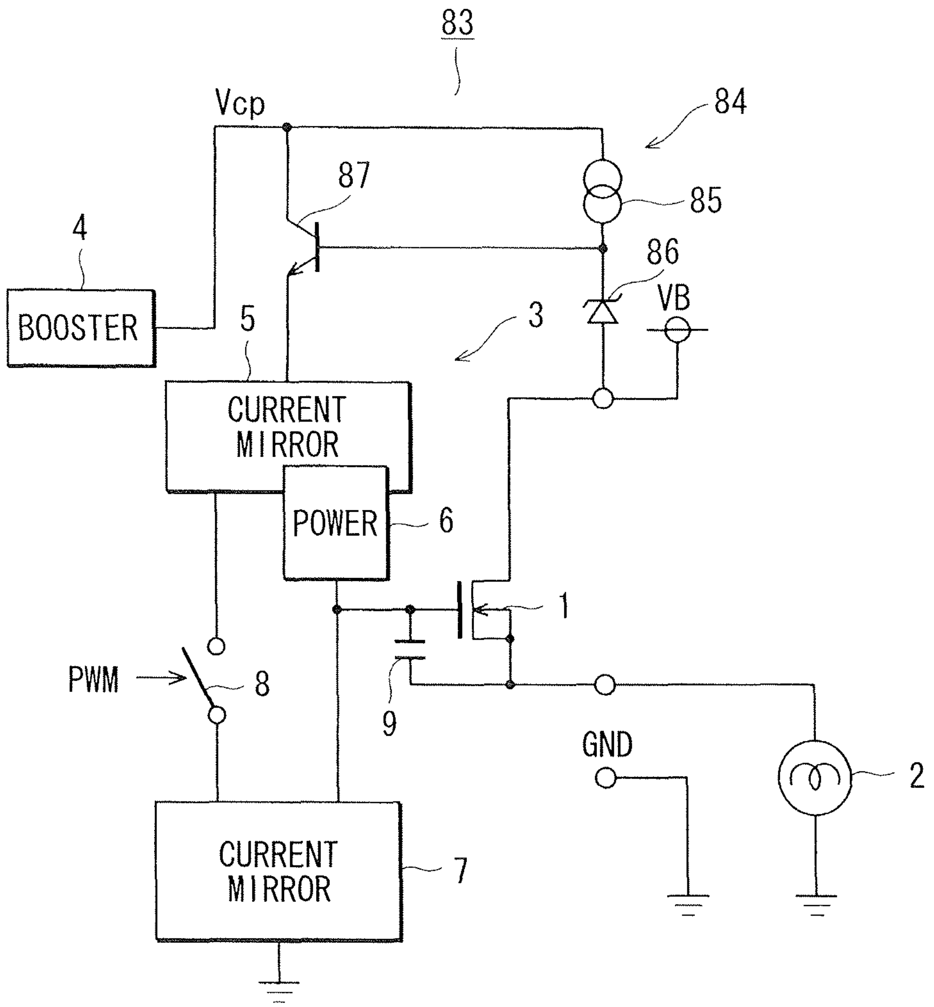
Figure 27:
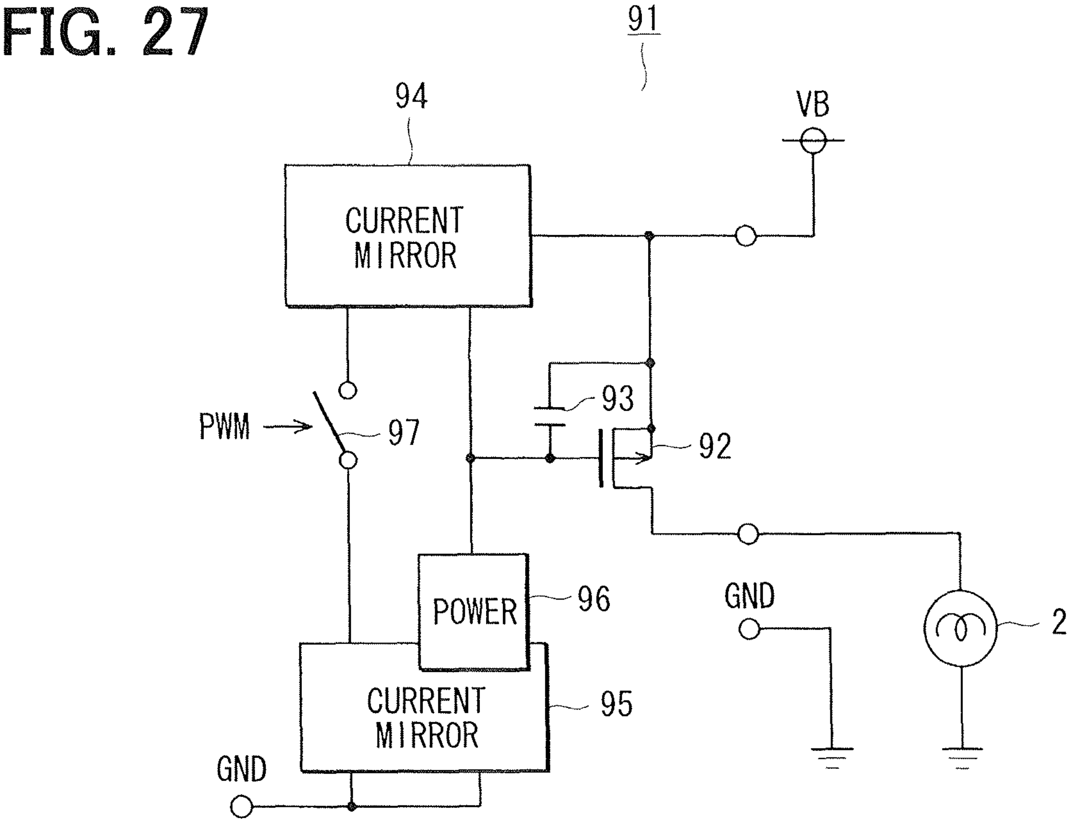
Figure 28:
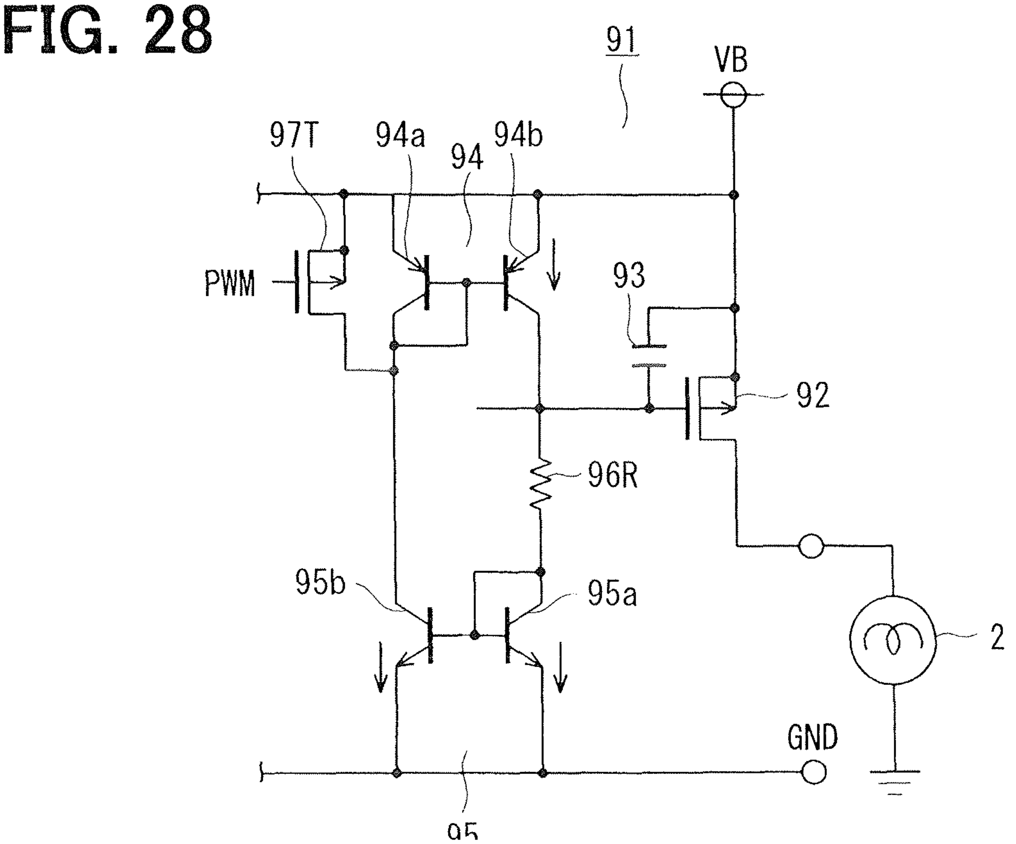
Figure 29:
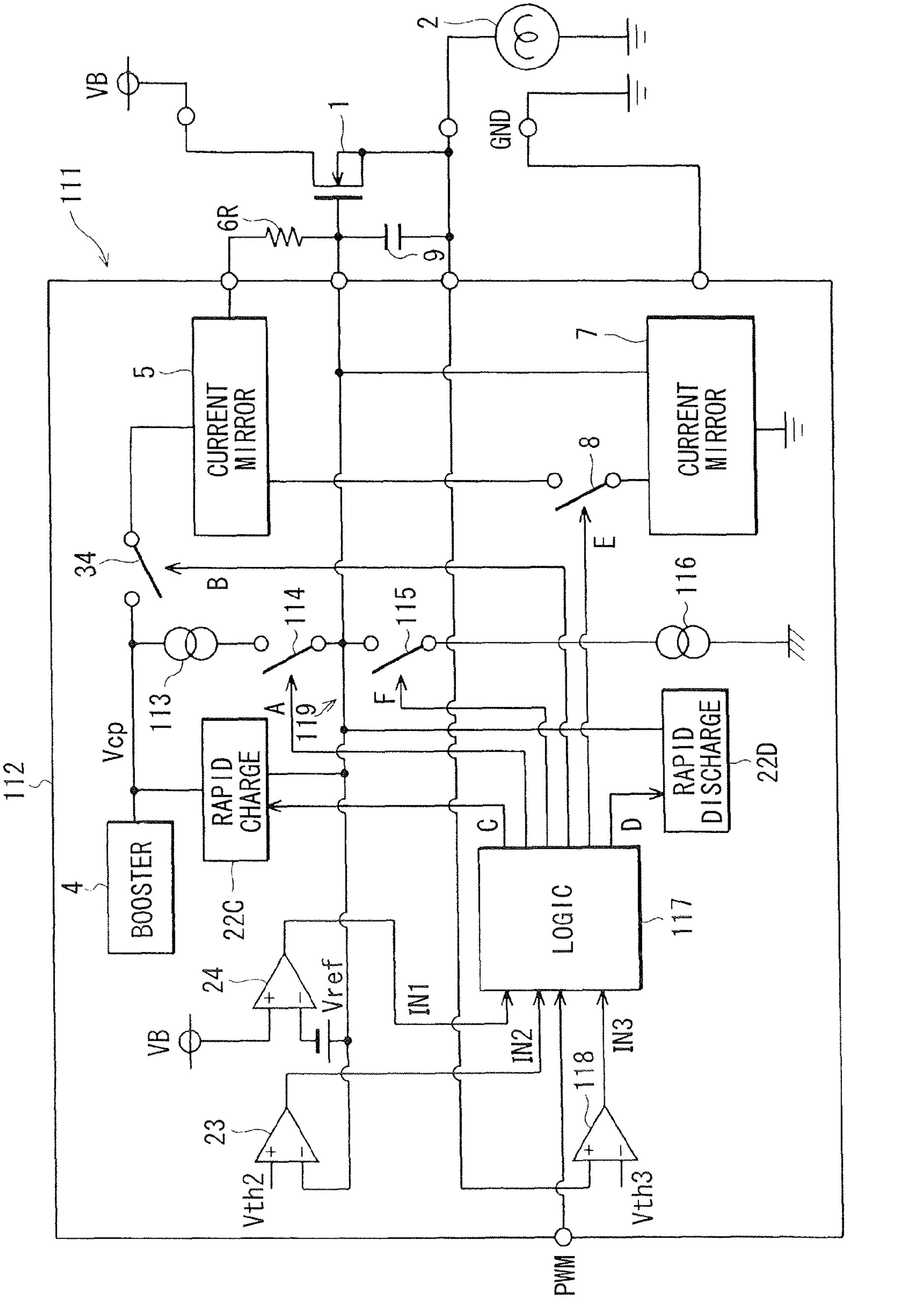
Figure 30:
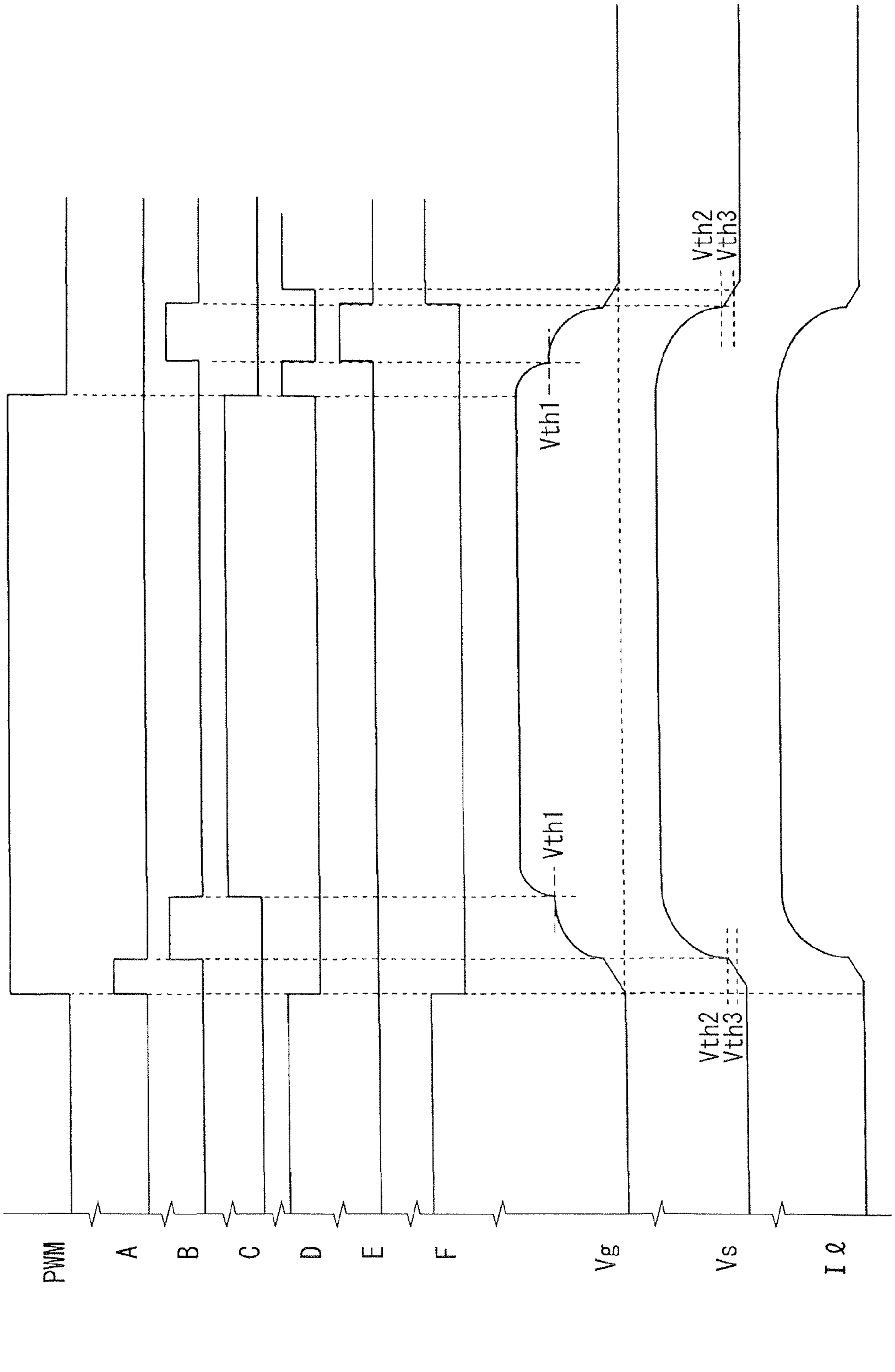
Figure 31:
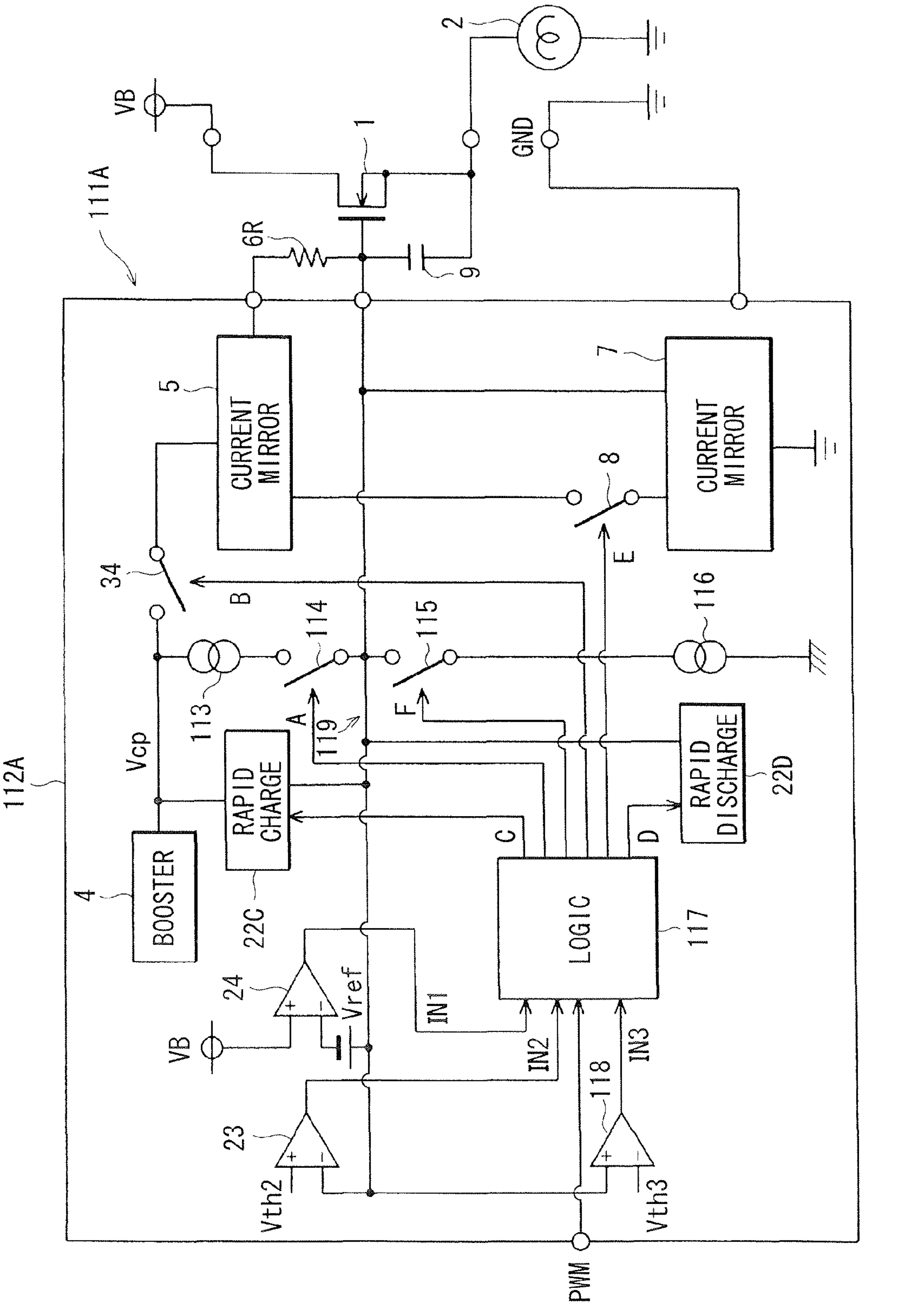
Figure 32:
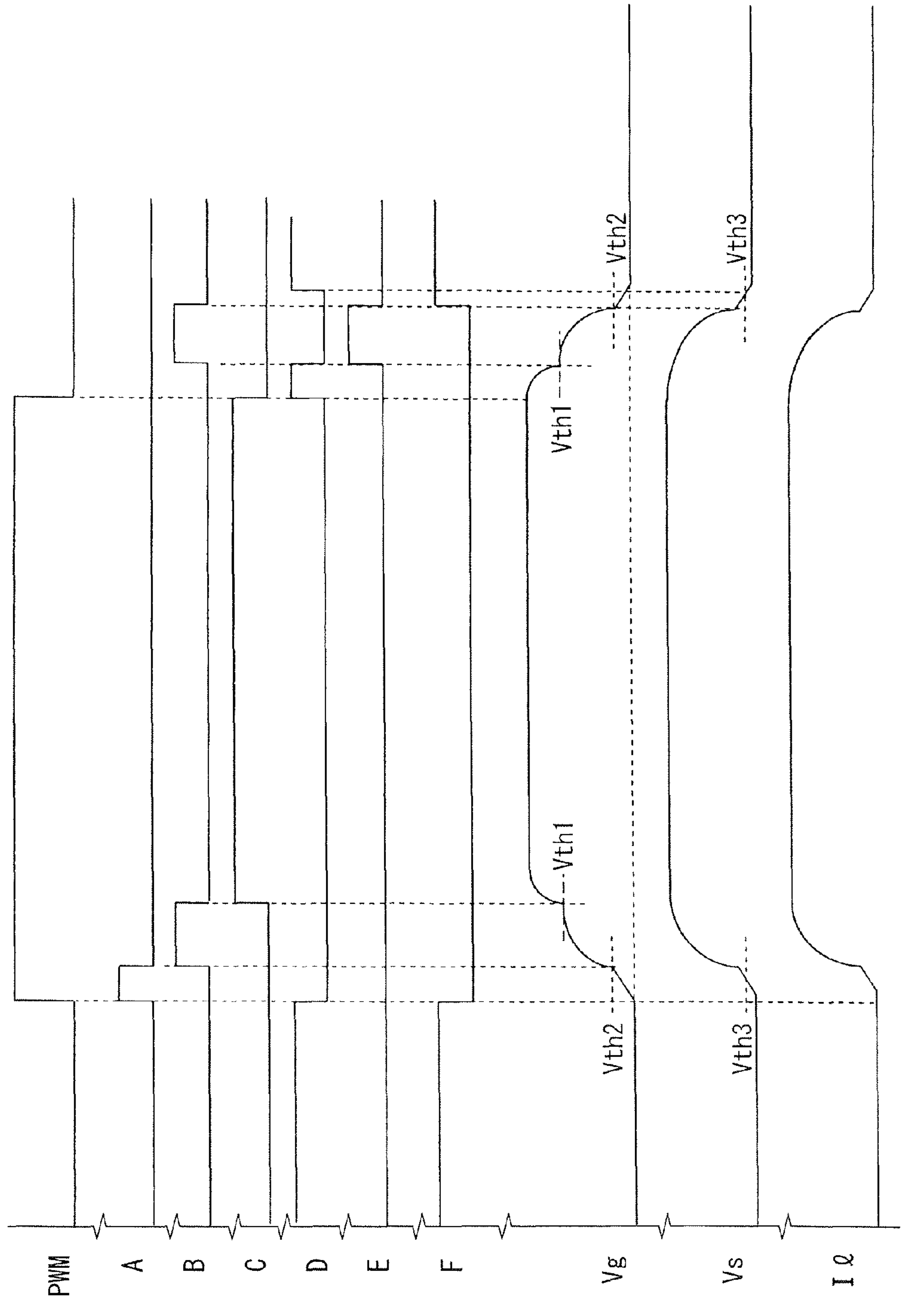
Figure 33:
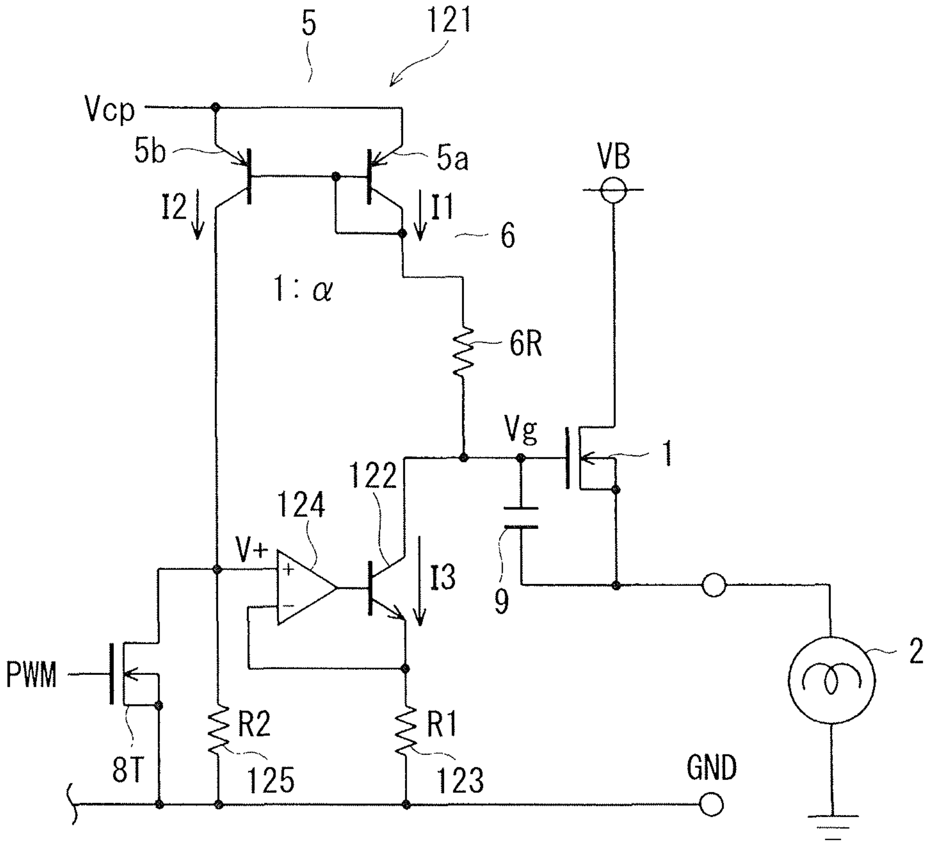

FIGS: 12A and 12B are a waveform diagram and a table of control signals applied in the fifth embodiment, respectively;

FIG. 13 is a circuit diagram of a signal output circuit according to a sixth embodiment;

FIGS. 14A and 14B are waveform diagrams of signals actually measured in the sixth embodiment;

FIGS. 15A and 15B are diagrams of noise levels in an AM band in the sixth embodiment;

FIGS. 16A and 16B are diagrams of noise levels in the AM band in case of using no rapid charge/discharge circuit in the sixth embodiment;

FIGS. 17A and 17B are diagrams of measured noise levels in the AM band in case of using the rapid charge/discharge circuit and using no rapid charge/discharge circuit, respectively, in the sixth embodiment;

FIG. 18 is a circuit diagram of a signal output circuit according to a seventh embodiment;

FIG. 19 is waveform diagram of signals developed at various points in the seventh embodiment;

FIG. 20 is a circuit diagram of a signal output circuit according to an eighth embodiment;

FIG. 21 is a circuit diagram of a signal output circuit according to a ninth embodiment;

FIG. 22 is waveform diagram of signals developed at various points in the ninth embodiment;

FIG. 23 is a circuit diagram of a signal output circuit according to a tenth embodiment;

FIGS. 24A and 24B are diagrams of noise levels in the AM band in case of using no rapid charge/discharge circuit in the tenth embodiment;

FIG. 25 is a circuit diagram of a signal output circuit according to an eleventh embodiment;

FIG. 26 is a circuit diagram of a signal output circuit according to a twelfth embodiment;

FIG. 27 is a circuit diagram of a signal output circuit according to a thirteenth embodiment;

FIG. 28 is a circuit diagram of the signal output circuit according to the thirteenth embodiment;

FIG. 29 is a circuit diagram of a signal output circuit according to a fourteenth embodiment;

FIG. 30 is waveform diagram of signals developed at various points in the fourteenth embodiment;

FIG. 31 is a circuit diagram of a signal output circuit according to a fifteenth embodiment;

FIG. 32 is waveform diagram of signals developed at various points in the fifteenth embodiment; and FIG. 33 is a circuit diagram of a signal output circuit according to a sixteenth embodiment.

DETAILED DESCRIPTION OF THE PREFERRED EMBODIMENT (First Embodiment)

Figure 1:
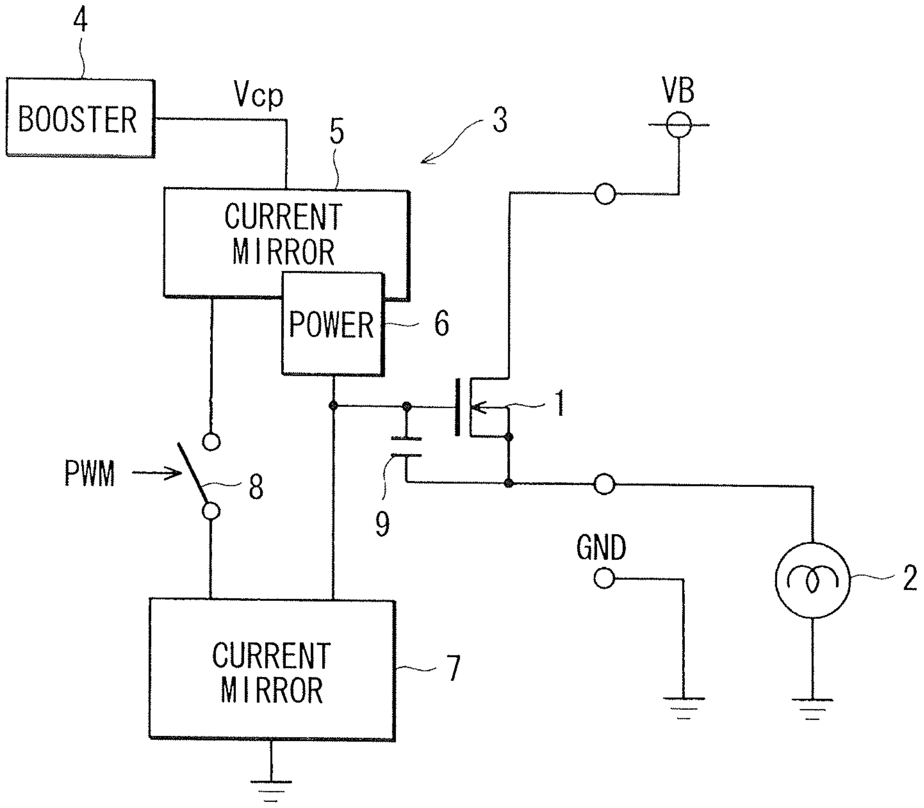
FIG. 1 is a circuit diagram of a signal output circuit, which is modeled in a block form, according to a first embodiment.

Referring to FIG. 1, an N-channel MOSFET (voltage-controlled switching element) 1 and an electric load (for example, an interior light, a rear light, a flasher light) 2 are connected in series between an electric power source (battery of a vehicle) and a ground. The electric power source supplies a power source voltage VB. In a signal output circuit 3, a booster circuit 4 is configured by, for example, a charge pump circuit, to generate and output a controlled power source voltage Vcp (for example, VB plus about 10 volts) by boosting the power source voltage VB of the power source. A first current mirror circuit 5 is provided at a side of the booster circuit 4 of the controlled power source voltage Vcp. The current mirror circuit 5 shares its part with a part of a current source (current generator circuit) 6.

A second current mirror circuit 7, which is a control current mirror circuit, is provided at a ground side. One current path of the current mirror circuit 5 is connected to the current mirror circuit 7 through a switch circuit 8, which is provided as on/off control part. The other current path of the current mirror circuit 5, that is, the current source 6 side, is also connected to the current mirror circuit 7.

A common junction between the current source 6 and the current mirror circuit 7 is connected to a gate (control terminal) of the MOSFET 1. A capacitor 9 is connected between the gate and a source of the MOSFET 1. The capacitor 9 is set to have a capacitance, which is greater than a capacitance component between a gate-source capacitance of the MOSFET 1.

Figure 2:
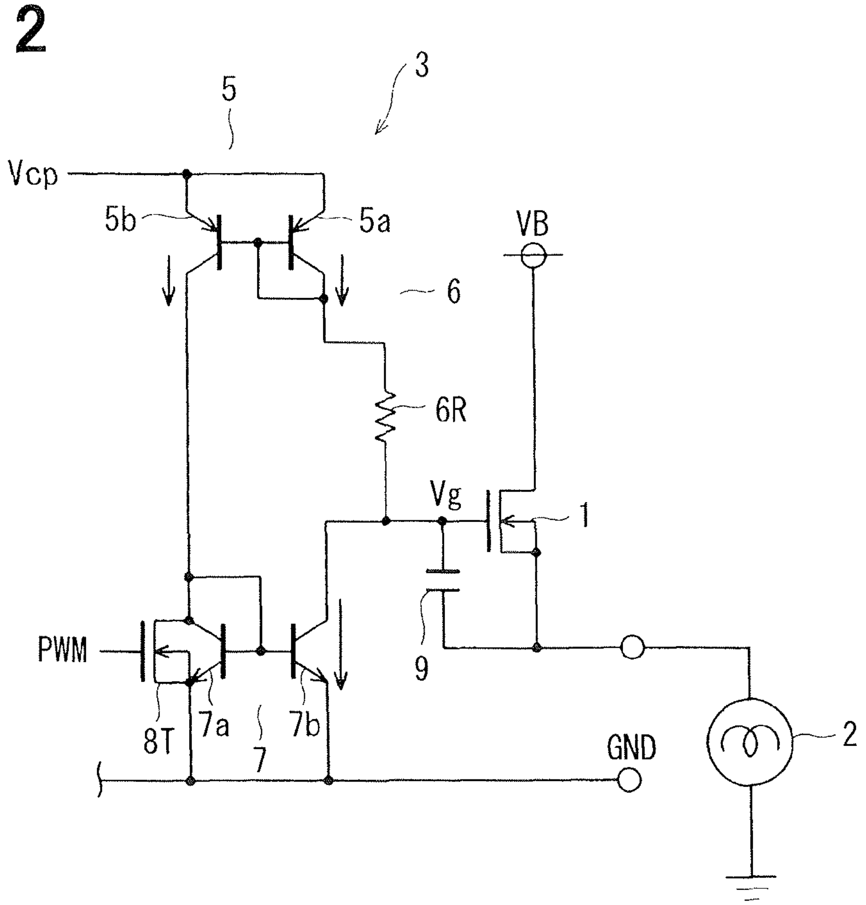
FIG. 2 is a circuit diagram of the signal output circuit according to the first embodiment.

The signal output circuit 3 in FIG. 1 is shown in more detail in FIG. 2. The current mirror circuit 5 at the controlled power source voltage Vcp side is formed of PNP transistors 5*a* and 5*b* in a mirror pair. Emitters of the PNP transistors 5*a* and 5*b* are connected to receive the controlled power source voltage Vcp and bases of the same are connected in common to a collector of the PNP transistor 5*a*. The collector of the transistor 5*a* is connected to the gate of the MOSFET 1 through a resistor 6R. The current source 6 is thus formed of the PNP transistor 5*a* and the resistor 6R. The current mirror circuit 7 at the ground side is formed of NPN transistors 7*a* and 7*b* in a mirror pair. Emitters of the NPN transistors 7*a* and 7*b* are connected to the ground and bases of the same are connected in common to a collector of the NPN transistor 7*a*. The collector of the NPN transistor 7*a* is connected to the PNP transistor 5*b*. The collector of the NPN transistor 7*b* is connected to the gate of the MOSFET 1 and the resistor 6R.

An N-channel MOSFET 8T, which corresponds to the switch circuit 8 in FIG. 1, is connected to the NPN transistor 7*a*. It is noted that the MOSFET 8T is shown in FIG. 1 as being connected in series in a current path between the collectors of the transistors 5*b* and 7*a* as the switch circuit 8, which drives the current mirror circuit 7. A PWM signal is applied to a gate of the MOSFET 8T to drive and control the light 2. Assuming that the mirror ratio between the PNP transistors 5*b* and 5*a* of the current mirror circuit 5 is set to 1:N, the mirror ratio between the NPN transistors 7*a* and 7*b* of the current mirror circuit 7 is set to be 1:2N.

Figure 3:
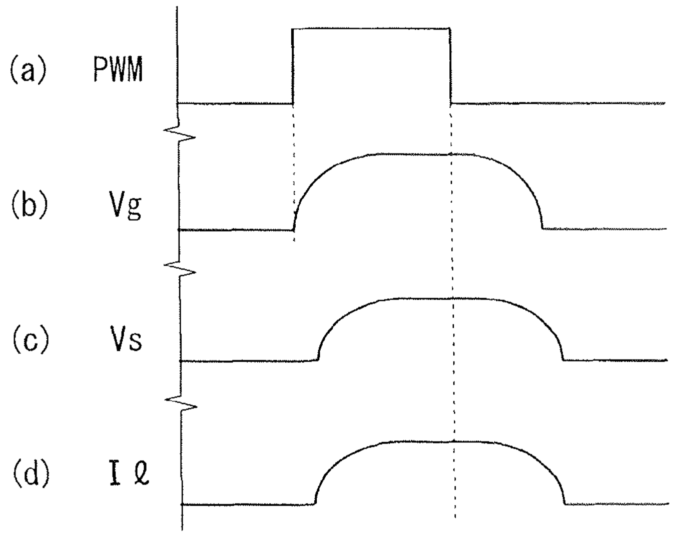
FIG. 3 is waveform diagram of signals developed at various points in the first embodiment.

As shown in FIG. 3, when a PWM signal indicated by a waveform (a) changes from a low level to a high level, the MOSFET 8T is turned on from the off-state. When the MOSFET 8T is in the off-state, the current mirror circuit 7 operates. As a result, the current mirror circuit 5 at the power source side also operates to supply a current. When the gate of the MOSFET 1 is at the low level, the MOSFET 1 is turned off and hence no current is supplied to the light 2.

When the MOSFET 8T is turned on, the current mirror circuit 7 stops its operation. At this time, the current supplied from the current mirror circuit 5 through the current source 6 flows to the gate of the MOSFET 1. The MOSFET 1 has a capacitance component between its gate and its source. The capacitor 9 is connected in parallel to the capacitance component of the MOSFET 1. The current flowing to the gate charges the capacitor 9 and the capacitance component of the MOSFET 1 and raises a gate potential Vg to a higher level. The MOSFET 1 is thus turned on to supply a current to the light 2.

In this operation, when the PWM signal changes its level from the low level to the high level as indicated by (a) in FIG. 3, the gate-source capacitance of the MOSFET 1 including the capacitor 9 is charged by the current, which flows through the resistor 6R of the current source 6, at a CR time constant. As a result, a gate potential Vg of the MOSFET 1 rises as indicated by a waveform (b) in FIG. 3. The gate potential Vg at this time is expressed as follows with "t" indicating time.

$$Vg=Vcp[1-\exp\{-t/(CR)\}] \quad (1)$$

Since the MOSFET 1 is configured in the source follower, a potential Vs of the source, which is common to the light 2, rises gradually as indicated by a waveform (c) in FIG. 3. The source potential Vs thus follows changes in the gate potential Vg. As a result, as indicated by a waveform (d) in FIG. 3, a current Il supplied to the light 2 also changes in the similar waveform as the source potential Vs.

When the PWM signal charges its level from the high level to the low level as indicated by (a), the transistors 7*b* and 5*b* are turned on. The gate-source capacitance of the MOSFET 1, which is in the charged state, is thus discharged at the CR time constant. The current mirror circuit 7 allows a current, which discharges electricity stored in the capacitor 9 and the like, as well as the current supplied from the current mirror circuit 5 to flow therethrough. The gate potential Vg and the source potential Vs also fall gradually or smoothly as indicated by (b) and (c), respectively. The current Il supplied to the light 2 also falls gradually as indicated by (d) similarly to the source potential Vs. The waveform of the current Il supplied to the light 2 is generally symmetrical between a rise time and a fall time. The current waveforms are thus generally turn-backs between the rise time and the fall time with respect to time.

According to the first embodiment, the MOSFET 8 controls the operation of the current mirror circuit 7 in accordance with the level change of the PWM signal applied to its gate so that the mirror current flows through the current source 6 by the operation of the current mirror circuit 7. This current flows to the gate of the MOSFET 1 thereby to discharge the electricity charged in the capacitance between the gate and the source of the MOSFET 1. When the operation of the current mirror circuit 7 is stopped, the current flowing from the current mirror circuit 5 through the current source 6 is supplied to the gate of the MOSFET 1 as the charging current.

The gate potential of the MOSFET 1 gradually changes in accordance with the time constant of the capacitance and an internal resistance component (resistance of the resistor 6R), which the current source 6 has. In addition, the charge current and the discharge current are constant current-controlled by the combination of the current source 6 and the current mirror circuits 5, 7, so that the changes in the voltage waveform at the charge time and the discharge time generally become turn-back shape with respect to time. As a result, the current I1 supplied to the light 2 is changed gradually to reduce radio noise in any case when the MOSFET 1 is turned on and off. The above operation is controlled by an open-loop control and is less susceptible to noises. As a result, the operation is controlled stably.

The capacitor 9 is connected between the gate and the source of the MOSFET 1, and the capacitance of the capacitor 9 is set to be larger than the capacitance component of the MOSFET 1. As a result, the rate of change of the gate potential waveform, the source voltage waveform and the current waveform shown in FIG. 3 are stabilized without being influenced by variations in the capacitance component of the MOSFET 1. Since the gate potential is raised to be higher, the on-resistance of the MOSFET 1 is reduced and heat generation is reduced.

The MOSFET 1 is driven at the high potential side, that is, operated as the source follower so that the source potential changes following changes in the gate potential. As a result, the current flowing to the light 2 also changes gradually and the radio noise is effectively reduced. The controlled power source voltage Vcp is supplied by boosting the power source voltage VB by the booster circuit 4 so that the MOSFET 1, which is driven according to the high side driving method, is driven to be fully turned on.

The current source 6 is formed in the current supply path of the controlled power source voltage Vcp and includes the resistor 6R, one end of which is connected to the gate of the MOSFET 1. As a result, the charge and discharge time constants are determined by the resistance of the resistor element 6R.

The operation of the current mirror circuit 7 connected in series with the current mirror circuit 5 is controlled in accordance with the level change of the PWM signal by the MOSFET 8T connected in parallel to the NPN transistor 7*b*. Thus, when the current mirror circuit 7 operates, the discharge current is supplied from the gate of the MOSFET 1. When the current mirror circuit 7 is stopped, the charge current is supplied to the gate of the MOSFET 1 by the current, which flows from the current mirror circuit 5 through the current source 6.

(Second Embodiment)

Figure 4:
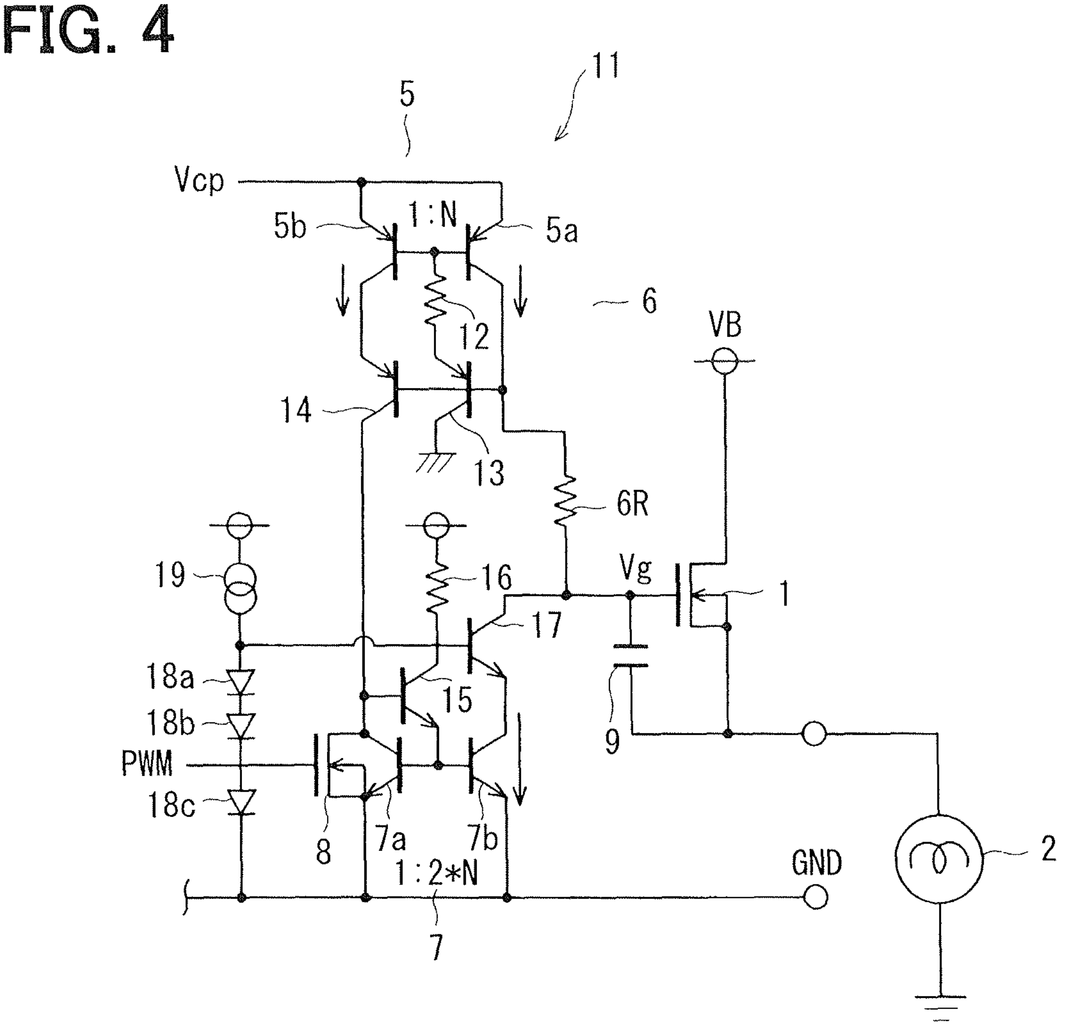
FIG. 4 is a circuit diagram of a signal output circuit according to a second embodiment.

A second embodiment is shown in FIGS. 4 and 5, in which parts similar to the first embodiment are designated by the similar reference numerals.

A signal output circuit 11 according to the second embodiment has transistors for correcting a current gain in addition to the current mirror circuits 5 and 7, which are provided at the power source side and the ground side, respectively. An emitter of a PNP transistor 13 is connected to the bases of the PNP transistors 5*a* and 5*b* through a resistor 12. A base and a collector of the PNP transistor 13 are connected to the collector of the PNP transistor 5*a* and the ground, respectively.

An emitter and a collector of a PNP transistor 14 are connected between the collector of the PNP transistor 5*b* and the collector of the NPN transistor 7*a*. The base of the PNP transistor 14 is connected to the collector of the PNP transistor 5*a* together with the base of the PNP transistor 14. The PNP transistor 14 is provided to avoid influence of the early effect by equalizing the emitter-collector voltages of the PNP transistors 5*a* and 5*b* to each other. An emitter of a NPN transistor 15 is connected to the bases of the NPN transistors 7*a* and 7*b*. A collector and a base of the NPN transistor 15 are connected to the power source through a resistor 16 and the collector of the NPN transistor 7*a*. A NPN transistor 17 and diodes 18 to 18*c* are provided to avoid influence of the early effect similarly as the transistor 14.

A collector and an emitter of a NPN transistor 17 are connected between the gate of the MOSFET 1 and the collector of the NPN transistor 7*b*. The three diodes 18*a* to 18*c* connected in series are connected between the power source and the ground through a current source 19. A base of the transistor 17 is connected to an anode of the diode 18*a*. A collector-emitter voltages of the NPN transistors 7*a* and 7*b* are both set to 2×Vbe.

According to the second embodiment, a rate of waveform change of a charge/discharge current relative to the gate of the MOSFET 1 is controlled with high accuracy by increasing an accuracy of a ratio of mirror operation of the current mirror circuits 5 and 7.

Figure 5A:
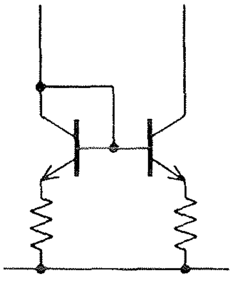
FIGS. 5A to 5C are circuit diagrams of variations of a current mirror circuit in the second embodiment.
Figure 5B:
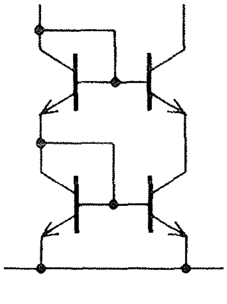
Figure 5C:
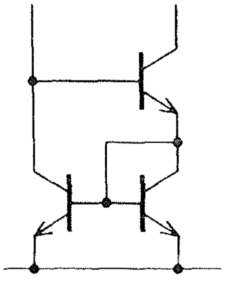

The current mirror circuits may be configured in a plurality of variations. For example, the current mirror circuits may be configured with emitter resistors, in cascade connection and in Wilson type as shown in FIGS. 5A, 5B and 5C, respectively.

(Third Embodiment)

Figure 6:
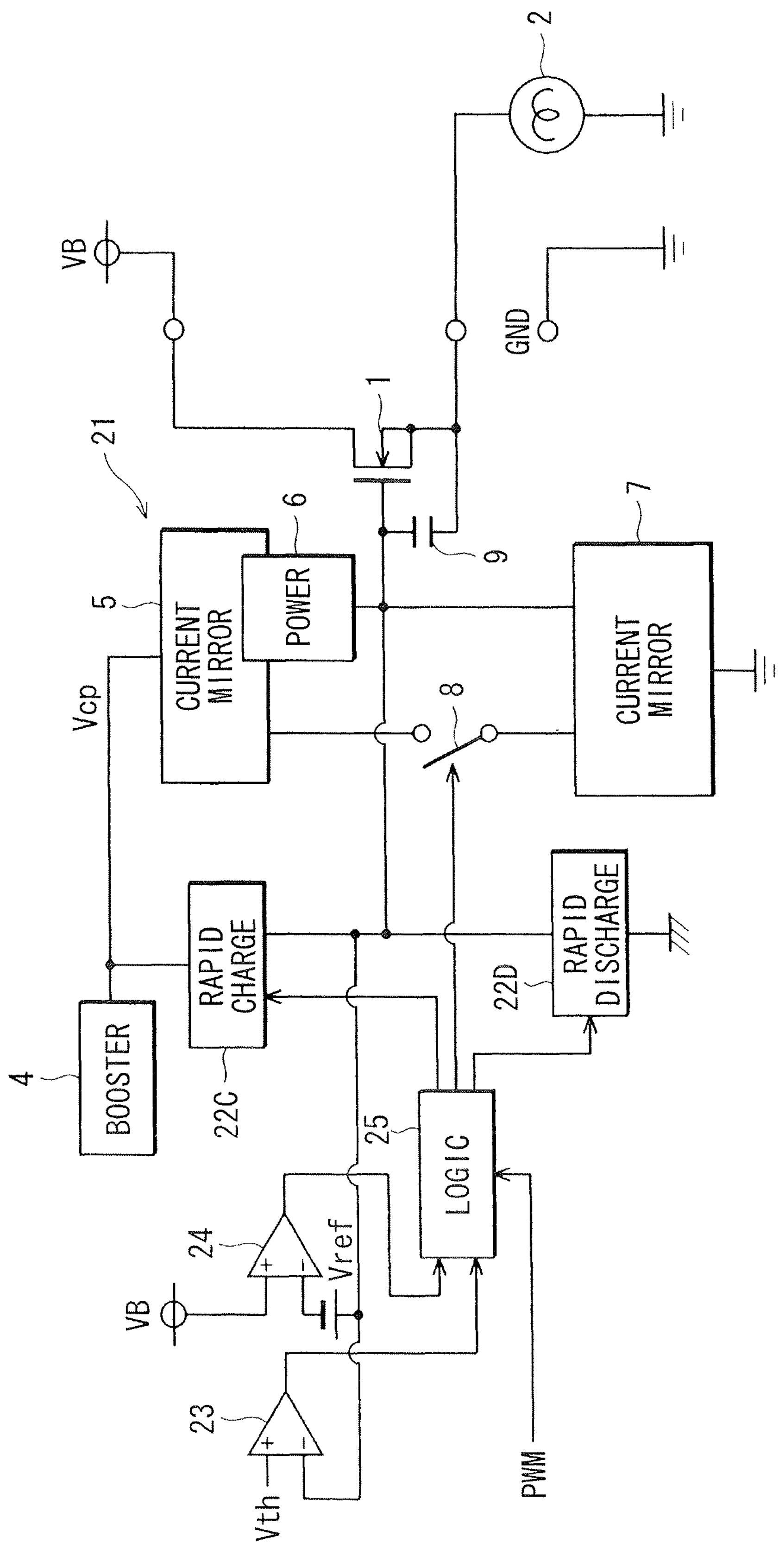
FIG. 6 is a circuit diagram of a signal output circuit according to a third embodiment.
Figure 7:
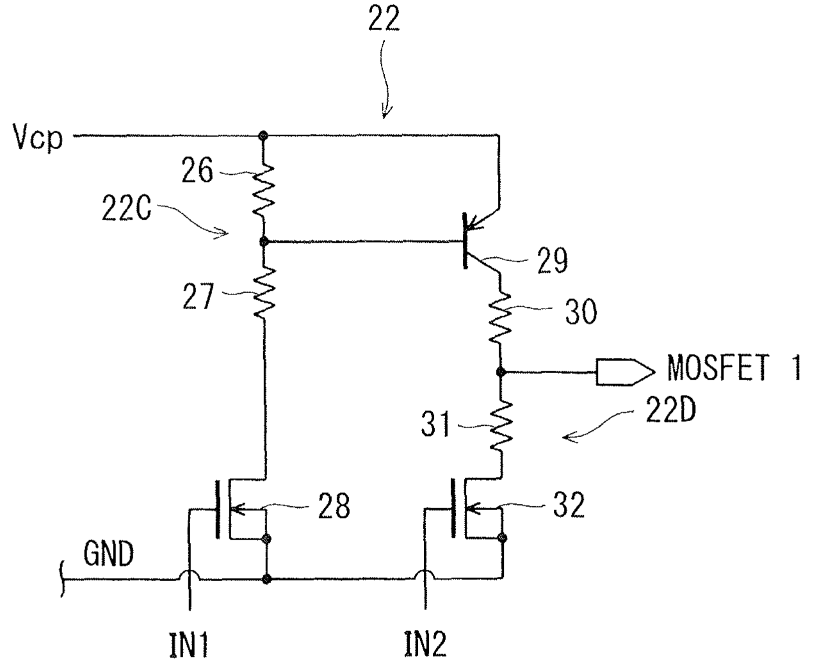
FIG. 7 is a circuit diagram of a rapid charge/discharge circuit in the third embodiment.
Figure 8:
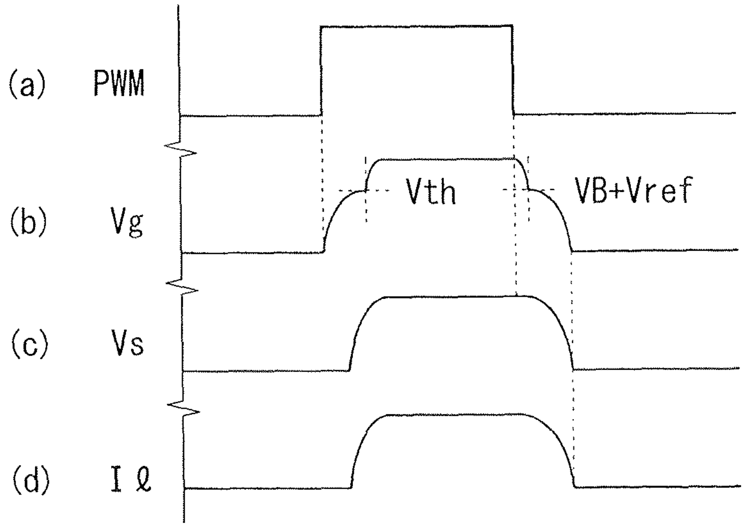
FIG. 8 is waveform diagram of signals developed at various points in the third embodiment.

A third embodiment is shown in FIGS. 6 to 8 and is different from the first embodiment in the following points.

A signal output circuit 21 according to the third embodiment is provided with a rapid charge circuit (charge assist circuit) 22C and a rapid discharge circuit (discharge assist circuit) 22D in addition to the signal output circuit 3 of the first embodiment. Further, comparators 23, 24, and a logic circuit 25 are provided for controlling the rapid charge circuit 22C and the rapid discharge circuit 22D. The circuit 22C and the rapid discharge circuit 22D are connected between the booster circuit 4 of the controlled power source voltage Vcp and the ground. A common junction of the rapid charge circuit 22C and the rapid discharge circuit 22D is connected to the gate of the MOSFET 1.

The comparators 23 and 24 are provided to control the logic circuit 25. The comparator 23 compares a predetermined threshold value Vth applied to its non-inverting input terminal and a gate potential of the MOSFET 1 applied to its inverting input terminal. The comparator 23 thus produces a comparison result signal to the logic circuit 25. The comparator 24 compares the power source voltage VB applied to its non-inverting input terminal and a potential applied to its inverting input terminal. This potential is lower than the gate potential of the MOSFET 1 by a reference voltage Vref. The comparator 24 thus produces a comparison result signal to the logic circuit 25.

The rapid charge circuit 22C and the rapid discharge circuit 22D are configured as shown in FIG. 7. These circuits 22C and 22D are configured as an integrated rapid charge/discharge circuit 22. A series circuit of resistors 26, 27 and a N-channel MOSFET 28 as well as a series circuit of a PNP transistor 29, resistors 30, 31 and a N-channel MOSFET 32 are connected between the controlled voltage Vcp and the ground. A base of the transistor 29 is connected to a common junction of the resistors 26 and 27. A common junction of the resistors 30 and 31 is connected to the gate of the MOSFET 1.

The rapid charge circuit 22C forms a bypass path, which passes a charge current to rapidly increase the gate potential after the MOSFET 1 has been fully turned on, in case that the gate of the MOSFET 1 is charged through the current source 6. The rapid discharge circuit 22D also forms a bypass path, which passes a discharge current to rapidly decrease the gate potential of the MOSFET 1 from the highest level to a level, at which the MOSFET 1 starts to be turned off, in case that the current mirror circuit 7 operates to discharge the capacitor 9 from the gate of the MOSFET 1 through the current source 6. The PWM signal is applied to the logic circuit 25 so that the logic circuit 25 operates to turn on and off the switch circuit 8. Further details of the configuration and operation will be described below with reference to the fifth embodiment.

A principal operation of the third embodiment will be described with reference to FIG. 8. When a PWM signal level indicated by (a) in FIG. 8 is low, output levels of the comparators 23 and 24 are high and low, respectively. Both the transistor 29 and the MOSFET 32 of the rapid charge/discharge circuit 22 are both in the off-state at this moment. When the PWM signal changes to the high level from this state, the logic circuit 25 is enabled. When the gate potential of the MOSFET 1 exceeds the threshold value Vth in the course of rising, the logic circuit 25 changes a control signal IN1 from a high level to a low level. The MOSFET 28 and the transistor 29 are thus turned on, and the charge current flows to the gate of the MOSFET 1 through the transistor 29 to raise the gate potential Vg rapidly as indicated by (b) in FIG. 8. The control signal IN1 is returned to the high level after an elapse of a predetermined time from changing to the low level.

When the PWM signal changes its level from the high level to the low level, the logic circuit 25 changes a control signal IN2 from a low level to a high level. The MOSFET 32 is thus turned on, and the bypass path is formed to pass the discharge current from the gate of the MOSFET 1 to lower the gate potential Vg rapidly. When the gate potential falls to be lower than the voltage (VB+Vref), the control signal IN2 is changed to the low level. Since the rapid charge/discharge circuit 22 operates as described above, a time interval for actually turning on the MOSFET 1 is made closer to a time interval of a high level pulse width of the PWM signal even when the rise and fall of the gate potential of the MOSFET 1 is gradually changed.

According to the third embodiment, the rapid charge/discharge circuit 22 forms the bypass path to increase the charge/discharge current relative to the gate of the MOSFET 1 in a part of the operation period and a part of the operation stop period of the current mirror circuit 7. A charge/discharge interval in a time interval, in which radio noise is not suppressed because the MOSFET 1 is thus driven to the full on-state, is shortened. As a result, the on-state interval of the MOSFET 1 is made closer to the interval indicated by the inputted control signal.

(Fourth Embodiment)

Figure 9:
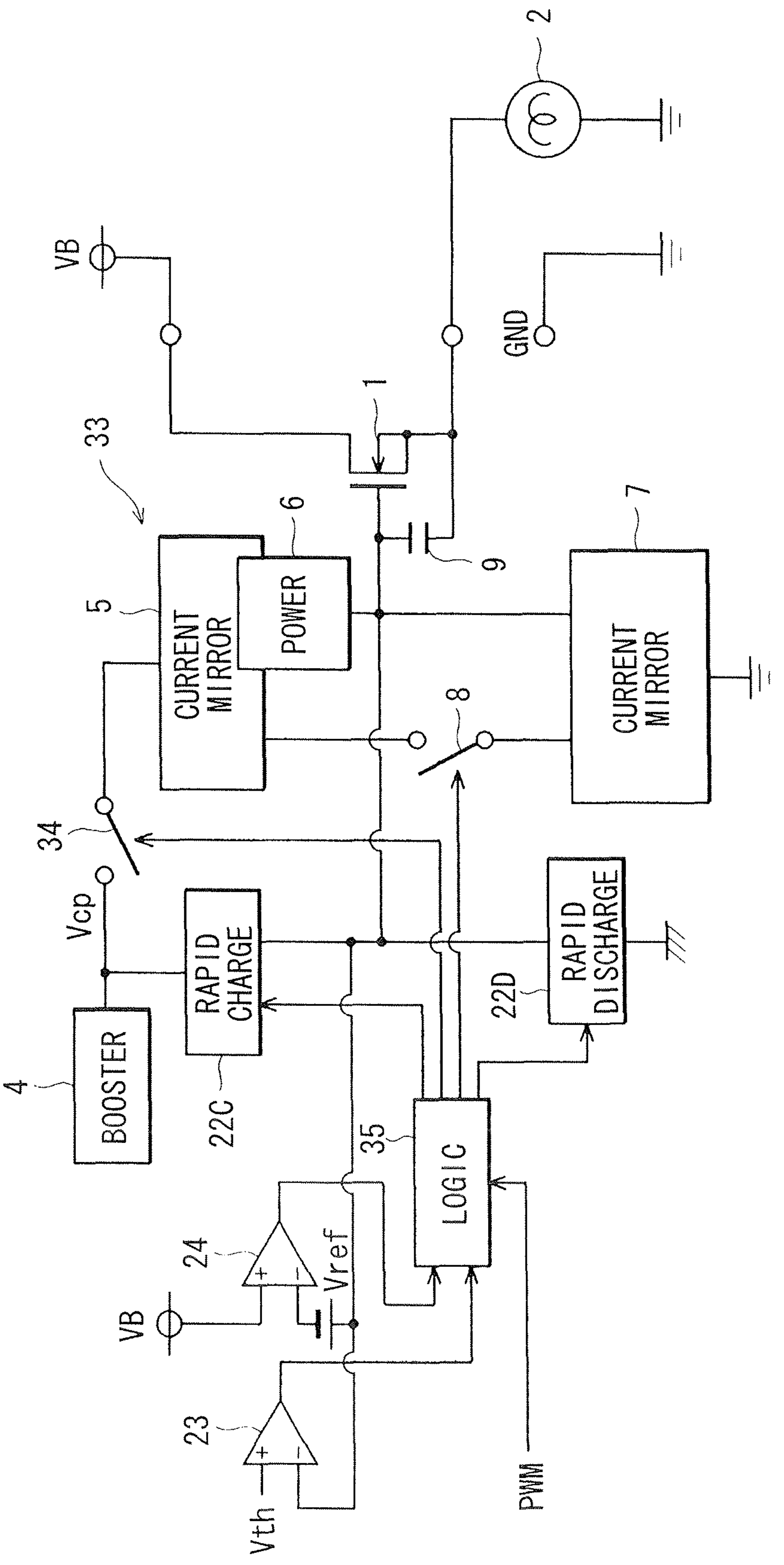
FIG. 9 is a circuit diagram of a signal output circuit according to a fourth embodiment.
Figure 10:
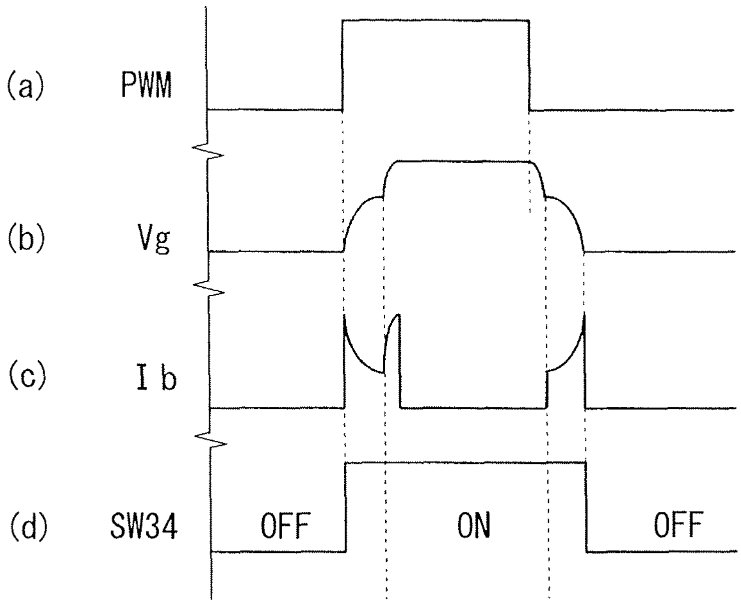
FIG. 10 is waveform diagram of signals developed at various points in the fourth embodiment.

A fourth embodiment is shown in FIGS. 9 and 10.

A signal output circuit 33 according to the fourth embodiment has a switch circuit 34 provided between the booster circuit 4 and the current mirror circuit 5 in the signal output circuit 21 according to the third embodiment. The switch circuit 34 is controlled by a logic circuit 35. As shown in FIG. 10, the logic circuit 35 controls the switch circuit 34 to be in the off-state while the PWM signal level indicated by (a) is low and turns on the switch circuit 34 when the PWM signal changes from the low level to the high level. Thus, the current mirror circuit 7 is operated as indicated by (a) and (d). When the electricity charged in the gate of the MOSFET 1 and the capacitor 9 are discharged and the gate potential is returned to the zero level, the logic circuit 35 turns on the switch circuit 34 again. As a result, the current of the booster circuit 4 flows only in a rise interval and a fall interval, in which the gate potential is changed as indicated by (c) in FIG. 10. The current consumption is thus reduced greatly.

(Fifth Embodiment)

Figure 11:
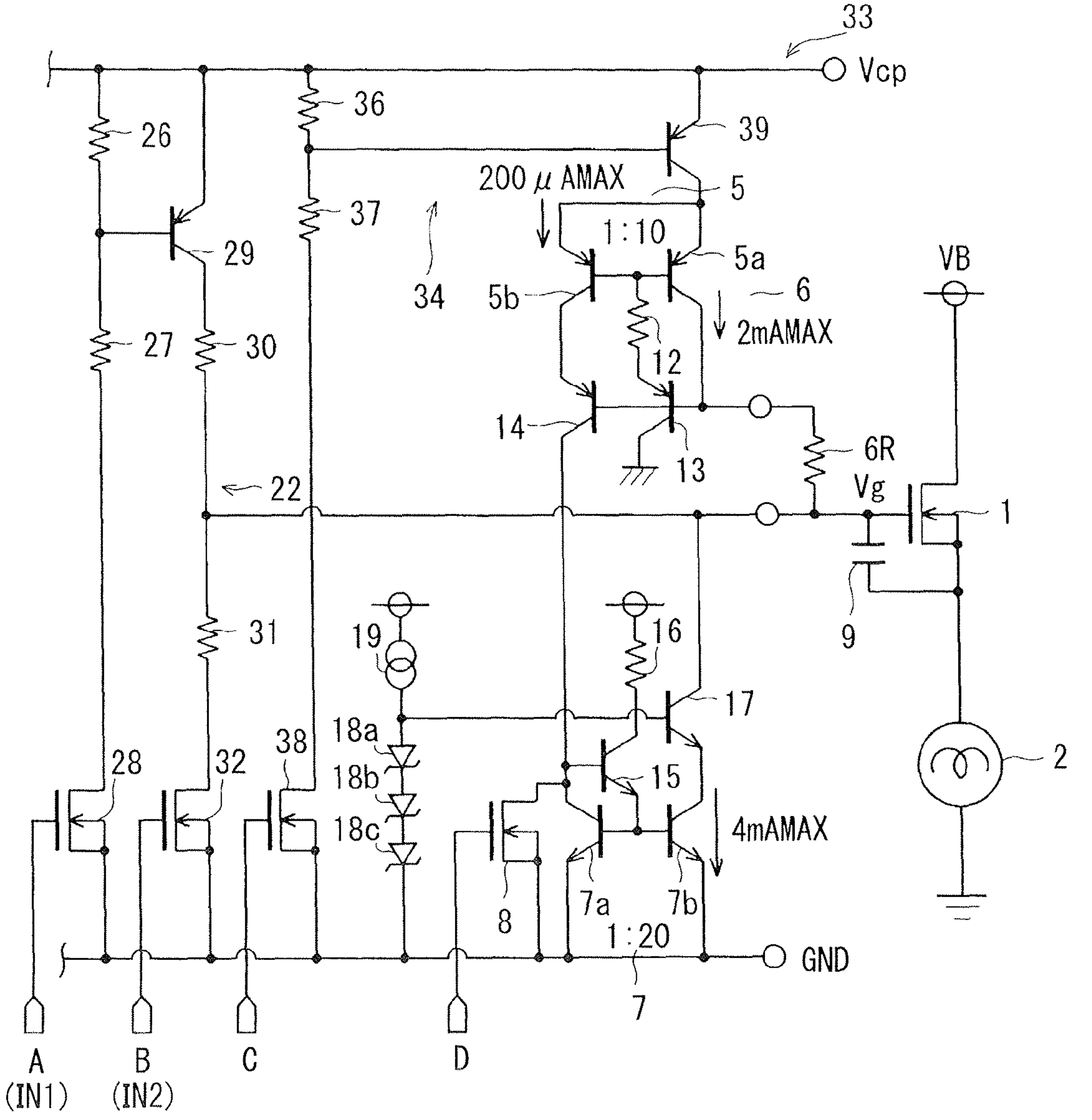
FIG. 11 is a circuit diagram of a signal output circuit according to a fifth embodiment.

A fifth embodiment is shown in FIGS. 11 and 12, which show the signal output circuit 33 of the fourth embodiment in more detailed configuration.

The current mirror circuits 5 and 7 are configured similarly to those of the second embodiment. The switch circuit 34 shown in FIG. 10 has the following configuration. A series circuit of resistors 36, 37 and an N-channel MOSFET 38 is connected between the controlled power source voltage Vcp and the ground. A base of a PNP transistor (switch circuit) 39 is connected to a common junction of the resistors 36 and 37.

The mirror ratio of the PNP transistors 5*a* and 5*b* in the current mirror circuit 5 is set to 1:10. When a collector current of a maximum of 200 μA flows at the PNP transistor 5*b* side, a collector current of 2 mA flows in the PNP transistor 5*a* side. Since the mirror ratio of the NPN transistors 7*a* and 7*b* in the current mirror circuit 7 is set to 1:20, a collector current of a maximum of 4 mA flows in the NPN transistor 7*b* side.

The transistor 39 is provided between the controlled power source voltage Vcp and the current mirror circuit 5. When the MOSFET 38 is turned off, the PNP transistor 39 is also turned off so that the controlled power source voltage Vcp is not supplied to the current mirror circuits 5 and 7. When the MOSFET 37 is turned on, the transistor 39 is also turned on so that the controlled power source voltage Vcp is supplied to the current mirror circuits 5 and 7.

Figures 12A, 12B:
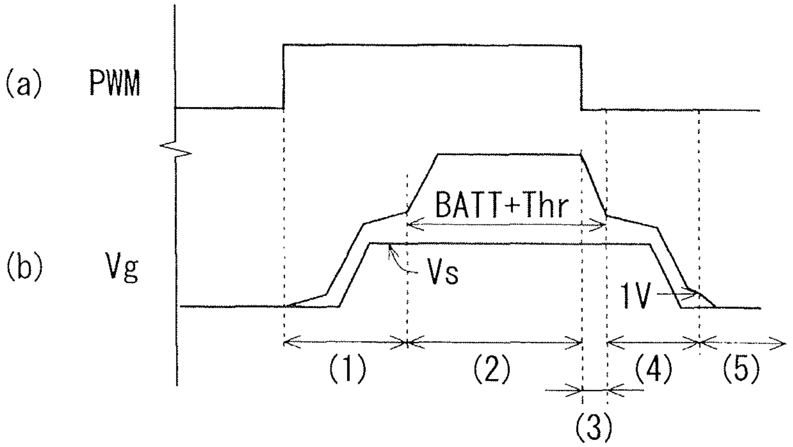

Control signals A, B, C and D applied to the gates of the MOSFETs 28, 32, 38 and 8 in FIG. 11 are indicated in FIG. 12B, respectively. In FIG. 12B, (1) to (5) indicate time intervals of the gate potential shown in FIG. 12A. The control signals A and B correspond to the control signals IN1 and IN2 shown in FIG. 7, respectively. In the time interval (1), in which the PWM signal changes its level from the low level (Lo) to the high level (Hi) and the gate potential of the MOSFET 1 gradually rises to start charging, the controls signals C and D are changed to the high level to supply the controlled power source voltage Vcp. The current mirror circuit 5 is thus operated and the current mirror circuit 7 is thus stopped from operating.

In the time interval (2), in which the charging side of the rapid charge/discharge circuit 22 is operated, the control signal A is changed to the high level so that the transistor 29 is turned on to supply the charge current. A voltage indicated as BATT+Thr in correspondence to the time interval (2) corresponds to the threshold voltage set for the comparator 24 shown in FIG. 9 and the like. In the time interval (3), in which the PWM signal changes its level from the high level to the low level to rapidly increase the gate potential of the MOSFET 1, only the control signal B is changed to the high level so that the discharging side of the rapid charge/discharge circuit 22 is operated. At this time, the PNP transistor 39 is turned off but the current mirror circuit 7 is maintained to be operable. In the time interval (4), in which the gate potential is gradually lowered, only the control signal C is changed to the high level so that the controlled power source voltage Vcp is supplied to the current mirror circuit 5.

In the last time interval (5), in which the gate potential falls to 1V, only the control signal B is changed to the high level to rapidly discharge so that the gate potential is surely changed to the low level. The power supply to the current mirror circuit 5 is interrupted in performing the rapid charging in the time intervals (3) and (5) so that the current consumption is reduced. The control logic shown in FIG. 12B may be realized by a hard-wired logic circuit, by CPLD (complex PLD) designed in a hardware descriptive language (HDL) or by FPGA (field programmable gate array).

According to the fifth embodiment, during the time interval, in which the discharging side of the rapid charge/discharge circuit 22 is operated, the supply of the controlled power source voltage Vcp is interrupted thereby to reduce power consumption.

(Sixth Embodiment)

A sixth embodiment is shown in FIGS. 13 to 17, in which the signal output circuit 33 is configured in an IC (integrated circuit).

A main part of the signal output circuit 33 is configured as an integrated circuit (IC) 40. The resistor 6R of the current source 6, the capacitor 9 and the MOSFET 1 are attached to the IC 40 from the external side. With this configuration, it is possible to trim the resistor 6R at an outside of the IC 40 and to adjust a resistance or capacitance by replacing the resistor 6R or the capacitor 9. As a result, the variation in the CR time constants is reduced, and the change rates of rise and fall are readily adjustable.

The examples of the PWM signal V(PWM), the gate potential V(GATE) of the MOSFET 1, the source potential V(OUT) and the load current I(OUT), which are actually measured in the circuit configuration shown in FIG. 13, are shown in FIGS. 14A and 14B. The carrier frequency of the PWM signal is assumed to be 100 Hz and the duty ratio of the same is assumed to be 50%. The rise time of the load current shown in FIG. 14A is 44.5 μs and the fall time of the load current shown in FIG. 14B is 44.6 μs. The load current generally changes symmetrically in rising and falling. Noise levels in an AM band in a case of wait state under a power-on condition (not input of PWM signal) and in a case of switching operation of the MOSFET 1 in response to the PWM signal are shown in FIGS. 15A and 15B, respectively. The peak levels are 10 dBμV at about 1.6 MHz in FIG. 15A and 35 dBμV at about 510 kHz in FIG. 15B, respectively.

The peak levels are also shown in FIGS. 17A and 17B, in which no rapid charge/discharge circuit 22 is provided, in correspondence to FIGS. 15A and 15B, respectively. The noise levels measured are shown in FIGS. 17A and 17B, in which the rapid charge/discharge circuit 22 is provided and not provided, respectively. It is understood that the peak of the noise level in FIG. 17B is 3 dBμV lower than that in FIG. 17A. However, as shown in FIGS. 16A and 16B, it is disadvantageous in that the pulse width of the load current increases by an amount of +30% relative to the pulse width of the PWM signal. The change is +10% in FIGS. 14A and 14B.

According to the sixth embodiment, the main part of the signal output circuit 33 is configured as the IC 40, and the resistor 6 and the capacitor 9 are externally connected to the IC 40. As a result, these circuit constants may be adjusted readily.

(Seventh Embodiment)

A seventh embodiment is shown in FIGS. 18 and 19 and different from the sixth embodiment in the following points.

In a signal output circuit 41 of the seventh embodiment, one more resistor 42 is connected to the IC 40 of the sixth embodiment. The resistor 42 is connected between the controlled power source voltage Vcp and the gate of the MOSFET 1. The resistor 42 and the resistor 6R are assumed to have resistances R1 and R2, respectively. When the gate potential rises, the charge current flows through the resistor 42. As a result, the charging is performed at a time constant determined by R1 and C. When the gate potential falls, the current mirror circuit 7 operates. As a result, the discharging is performed at a time constant determined by R1//R2 and C. The discharge time constant at the fall time is independently adjustable as indicated by (c) in FIG. 19.

(Eighth Embodiment)

An eighth embodiment is shown in FIG. 20. A signal output circuit 43 according to the eighth embodiment is configured differently from the signal output circuits according to the first to the seventh embodiments. That is, the resistor 6R forming the current source 6 is not provided. Instead, the collector of the PNP transistor 5*a*, which is one of the mirror pair forming the current mirror circuit 5, is directly connected between the controlled power source voltage Vcp and the gate of the MOSFET 1. A series circuit of a current source 44, a NPN transistor 45 and a resistor 46 is connected between a power source of a voltage Vcc and the ground. The power source voltage Vcc is set to be lower than that of the controlled power source voltage Vcp. An internal transistor (not shown) forming the current source 44 form a mirror pair with the PNP transistor 5*a*.

A current source 47 is connected between the power source voltage Vcc and the switch circuit 8 in place of the PNP transistor 5*b*. A transistor (not shown) forming the current source 47 also forms a mirror pair with the transistor forming the current source 44. The controlled poser source voltage Vcp is supplied to a non-inverting input terminal of an amplifier 48 forming a differential amplifier circuit. The gate of the MOSFET 1 is connected to an inverting input terminal of the amplifier 48.

An output terminal of the amplifier 48 is connected to a non-inverting input terminal of an amplifier of a next stage. An emitter of the NPN transistor 45 is connected to an inverting input terminal of the amplifier 49. An output terminal of the amplifier 49 is connected to a base of the transistor 45. The current source 44, the amplifier 49, the NPN transistor 45 and the resistor 46 thus form a voltage-current converter circuit 100. The conversion circuit 100, the amplifier 48 and the current mirror circuit 5*a* form a current source (current generator circuit) 101.

In operation of the eighth embodiment, the amplifier 48 outputs to the amplifier 49 a voltage signal, which corresponds to a difference between the controlled power source voltage Vcp and the gate potential of the MOSFET 1. The amplifier 49 operates to supply a current I1(t) in correspondence to the voltage signal of the amplifier 49. It is assumed that a mirror ratio of the current source 44 and the PNP transistor 5*a* is 1:α, a mirror ratio of the current sources 44 and 47 is 1:1, an amplification gain of the amplifier 48 is β, a mirror ratio of the current mirror circuit 7 is 1:γ, a current supplied to the gate of the MOSFET 1 through the PNP transistor 5*a* is I2(t) and the gate potential of the MOSFET 1 is Vg. It is further assumed that the gate-source capacitance of the MOSFET is C and a charge time relative to the gate is t. The following equations hold with these assumptions.

$$I1(t)=\{Vcp-Vg(t)\}\times\beta/R \quad (2)$$

$$I2(t)=I1(t)\times y=\{Vcp-Vg(t)\}\times\beta\times\gamma/R \quad (3)$$

$$\text{If } \alpha=\beta\times\gamma,\ I2(t)=\{Vcp-Vg(t)\}\times\alpha/R \quad (4)$$

$$C\times Vg(t)=I2(t)\times t \quad (5)$$

$$Vg(t)=I2(t)\times t/C=Vcp\times\{1/(1+CR/\alpha t)\} \quad (6)$$

If both terms are integrated, the gate potential Vg is expressed as follows.

$$Vg=Vcp\times f1-\exp\{-\alpha/(CR)\}] \quad (7).$$

The foregoing operation is performed at the time of switching of the switch circuit 8 from the on-state to the off-state. When the switch circuit 8 is switched from the off-state to the on-state, the gate of the MOSFET 1 is discharged by operation of the current mirror circuit 7 and the current source 101.

According to the eighth embodiment, as described above, the amplifier 48 outputs to the amplifier 49 the voltage signal corresponding to the difference between the controlled power source voltage Vcp and the gate potential Vg of the MOSFET 1. The amplifier 49 supplies the resistor 46 with the current corresponding to the voltage signal. Thus, in the similar manner as in the first embodiment, the gate of the MOSFET 1 is charged and discharged at the time constant CR.

(Ninth Embodiment)

A ninth embodiment is shown in FIGS. 21 and 22. In this embodiment, circuits for controlling transistors are integrated in an integrated circuit (IC).

In a signal output circuit 50, a current mirror circuit 51 formed of a mirror pair of two PNP transistors 51*a* and 51*b* is connected to the controlled power source voltage Vcp side. Collectors of the PNP transistors 51*a* and 51*b* are connected to collectors of NPN transistors 52*b* and 53*b*, respectively. Bases of the PNP transistors 51*a* and 51*b* are connected to a collector of the PNP transistor 51*a*. A collector of the PNP transistor 51*b* and a collector of the NPN transistor 53*b* are connected to the gate of the MOSFET 1.

The NPN transistors 52*b* and 53*b* form mirror pairs with NPN transistors 52*a* and 53*a*, respectively, thereby to provide control current mirror circuits 52 and 53 connected to the ground side. Bases of the NPN transistors 52*a* and 52*b* are connected to a collector of the NPN transistor 52*a*. Bases of the NPN transistors 53*a* and 53*b* are connected to a collector of the NPN transistor 53*a*. For example, a mirror ratio of the current mirror circuits 51 and 53 is set to 1:20 and a mirror ration of the current mirror circuit 52 is set to be 1:1.

Collectors of the NPN transistor 52*a* and 53*a* are connected to collectors of PNP transistors 54*b* and 54*c*, respectively. The PNP transistors 54*b* and 54*c* are in a mirror pair with the PNP transistor 54*a* to form a current mirror circuit 54. Emitters of the PNP transistors 54*a* to 54*c* are all connected to the voltage Vcc. A collector of the PNP transistor 54*a* is connected to bases of the PNP transistors 54*a* to 54*c* and grounded through a variable resistor 55.

Since mirror currents, which flow in the current mirror circuits 52 and 53, are controlled by the current mirror circuit 54, the mirror currents of the current mirror circuits 52 and 53 are determined by a resistance of the resistor 55 and an output voltage of a differential amplifier 61. For example, it is so set that the mirror current of a maximum of about 100 μA flows in the PNP transistor 51*a* side.

The controlled power source voltage Vcp is supplied to a non-inverting input terminal of an amplifier 58 through a resistor 56. The gate of the MOSFET 1 is connected to an inverting input terminal of the amplifier 58 through a resistor 57. The non-inverting input terminal is connected to the ground through a resistor 59, and the non-inverting input terminal is connected to an output terminal of the amplifier 58 through a resistor 60. The output terminal is connected to a base of a NPN transistor 73. A collector of the NPN transistor 73 is connected to the collector of the PNP transistor 54*a*. An emitter of the NPN transistor 73 is connected to a resistor 55. Thus, a differential amplifier circuit 61 is formed by the amplifier 58 and associated components.

N-channel MOSFETs 62 and 63 are connected in parallel between the collectors and the emitters of the NPN transistor 52*a* and 53*a*, respectively, as control part. A gate of the MOSFET 63 is connected to a signal input terminal IN, and a gate of the MOSFET 62 is connected to the signal input terminal IN through an output terminal of a NOT gate 64.

A series circuit of a PNP transistor 65 and a N-channel MOSFET 66 is connected between the controlled power source voltage Vcp and the ground. A common junction (collector of the PNP transistor 65 and drain of the MOSFET 66) is connected to the gate of the MOSFET 1. A series circuit of resistors 67 and 68 is connected between the power source of the voltage VB and the ground. A common junction of the resistors 67 and 68 is connected a non-inverting input terminal of a comparator 69. The source of the MOSFET 1 is connected to an inverting input terminal of the comparator 69. An output terminal of the comparator 69 is connected to one input terminals of OR gates 70 and 71.

The other input terminal of the OR gate 70 is connected to an output terminal of a NOT gate 64. The other input terminal of the OR gate 71 is connected to the input terminal IN. An output terminal of the OR gate 70 is connected to the base of the PNP transistor 65. An output terminal of the OR gate 71 is connected to the gate of the MOSFET 66 through the NOT gate 72. The current mirror circuit 54, the resistor 55 and the operational amplifier 61 form a current source (current generator circuit) 102.

The operation of the ninth embodiment is shown with reference FIG. 22. When the input terminal IN, to which the PWM signal indicated by (a) in FIG. 22 is applied, is at a low level, the current mirror circuits 52 and 53 are turned off and on, respectively. Since the current mirror circuit 51 also is turned off, the gate of the MOSFET 1 is discharged to the low level and the MOSFET 1 is in the off-state. Since the source potential is at the low level at this moment, the output level of the comparator 69 is high as indicated by (d) and the output levels of the OR gates 70 and 71 also are high. The PNP transistor 65 and the MOSFET 66 are in the off-state as indicated by (e) and (f), respectively.

When the PWM signal applied to the input terminal IN is changed to a high level as indicated by (a), the current mirror circuits 52 and 53 are turned on and off, respectively. Since the current mirror circuit 51 is turned on, the gate of the MOSFET 1 is charged and the gate potential Vg rises as indicated by (b) in FIG. 22. A charge current Ic, which flows to the gate at this moment, is expressed as follows.

$$Ic=\alpha\times(Vcp-Vg)/R \quad (8)$$

The source potential Vs indicated by (c) also rises as the gate potential Vg rises. When it rises above a reference voltage set by the resistors 67 and 68, the output level of the comparator 69 changes from the high level to the low level as indicated by (d). An output level of the OR gate 70 becomes low and the PNP transistor 65 is turned on as indicated by (e) thus forming a rapid charge path. As a result, the gate of the MOSFET 1 is rapidly charged. In the course of rising of the gate potential Vg of the MOSFET 1, an output voltage of the differential amplifier circuit 61 (emitter voltage of the NPN transistor 73) falls. Since the constant current value is decreased, the current, which flows to the gate of the MOSFET 1 through the current mirror circuits 51 and 54, is also decreased.

When the PWM signal at the input terminal IN is changed to the low level from the high level, the PNP transistor 65 is turned off as indicated by (e). The rapid charge path is interrupted and the output level of the OR gate 71 becomes low. The MOSFET 66 is turned on to form the rapid discharge path as indicated by (f), and the gate potential of the MOSFET 1 is rapidly decreased. Since the current mirror circuits 51 and 53 are turned off and on, respectively, discharging through the NPN transistor 53*b* is performed at the same time. Since the source potential Vs falls as the gate potential Vg falls, the output level of the comparator 69 is changed to a high level. The MOSFET 66 is thus turned off and the rapid discharge path is interrupted. The discharging is performed by only the current mirror circuit 53 thereafter. When the gate potential of the MOSFET 1 becomes low, the original state is restored.

According to the ninth embodiment described above, the differential amplifier circuit 61 outputs to the collector of the PNP transistor 54*a* the differential voltage between the controlled power source voltage Vcp and the gate potential Vg of the MOSFET 1. The charge current supplied to the gate of the MOSFET 1 through the current mirror circuits 52 and 54 is thus controlled. The comparator 69 compares the source potential of the MOSFET 1 with the reference voltage set in accordance with the power source voltage VB so that the formation of the rapid charge path and the rapid discharge path are formed by the output signal of the comparator 69. Since the source potential of the MOSFET 1 indicates the on-state of the MOSFET 1, the charge/discharge current is increased for an appropriate interval by controlling the formation of the rapid charge/discharge path based on a result of comparison of the source potential with the reference voltage.

(Tenth Embodiment)

A tenth embodiment is shown in FIGS. 23, 24A and 24B. FIG. 23 is a counterpart of FIG. 1.

A signal output circuit 81 according to the tenth embodiment is different from the first embodiment shown in FIG. 1 in that a capacitor 9 is connected between the gate of the MOSFET 1 and the ground. FIGS. 24A and 24B are counterparts of FIGS. 16A and 16B. The waveforms are measured based on the circuit shown in FIG. 11, in which no rapid charge/discharge circuit is provided. In this embodiment, the waveforms of rising and falling of the gate potential are not similar to the sinusoidal waveform of each of the foregoing embodiments. The gate potential Vg changes more gradually but still is effective to reduce radio noise.

(Eleventh Embodiment)

An eleventh embodiment is shown in FIG. 25. A signal output circuit 82 of the eleventh embodiment is configured to drive the light 2 at the low side of the light 2. In this embodiment, no booster circuit is necessary and the MOSFET 1 is driven by using the voltage Vcc.

(Twelfth Embodiment)

A twelfth embodiment is shown in FIG. 26 and different from the first embodiment as follows.

A signal output circuit 83 of the twelfth embodiment has a constant voltage circuit 84 between the booster circuit 4 the current mirror circuit 5. That is, a series circuit of a current source 85 and a Zener diode 86 is connected between the booster circuit 4 of the controlled power source voltage Vcp and the power source VB. A common junction between the booster circuit 4 and the power source VB is connected to a base of a NPN transistor 87. A collector of the NPN transistor 87 is connected to the booster circuit 4 and an emitter of the same is connected to the current mirror circuit 5 (emitters of the PNP transistors 5*a* and 5*b*).

The power source voltage supplied to the current mirror circuit 5 is regulated to VB+Vz−VF, in which Vz indicates a Zener voltage of the Zener diode 86. The current mirror circuit 5 is thus supplied with a power source voltage, which is higher than the drain potential of the MOSFET 1 by a voltage Vz-VF. The MOSFET 1 is thus driven stably.

(Thirteenth Embodiment)

A thirteen embodiment is shown in FIGS. 27 and 28 and different from the first embodiment as follows.

A signal output circuit 91 of the thirteenth embodiment is configured such that the light 2 is driven by a P-channel MOSFET (switching element) 92 at the high side. The MOSFET 92 is connected between the power source of the power source voltage VB and the light 2. A capacitor 93 is connected between a source and a gate of the MOSFET 92. A current mirror circuit 94 is provided at the power source voltage VB side and a current mirror circuit 95 is provided at the ground side. One current path of the current mirror circuit 94 is connected to the gate of the MOSFET 92 and a current source 96. The current source 96 has a part, which also forms a part of the current mirror circuit 95. The other current path of the current mirror circuit 94 is connected to the other current path of the current mirror circuit 95 through a switch circuit (control part) 97.

The signal output circuit 91 is configured in detail as shown in FIG. 28. The current mirror circuit 94 is formed of a mirror pair of PNP transistors 94*a* and 94*b*. Bases of the PNP transistors 94*a* and 94*b* are connected to a collector of the PNP transistor 94*a*. A P-channel MOSFET 97T is connected in parallel to the PNP transistor 94*a*. The MOSFET 97T is connected to a switch circuit 97 shown in FIG. 27. The circuit 95 is formed of a mirror pair of NPN transistors 95*a* and 95*b*, bases of which are connected to the collector of the NPN transistor 95*a*. The collector of the NPN transistor 95*a* is connected to the gate of the MOSFET 92 through a resistor 96R. That is, the current source 96 is formed of the NPN transistor 95*a* and the resistor 96R. If a mirror ratio of the current mirror circuit 95 is 1:1 for example, a mirror ratio of the current mirror circuit 94 is set to 1:2.

The thirteenth embodiment operates as follows. When the PWM signal is at a low level, a high level signal, which is an inverse of the low level, is applied to the gate of the MOSFET 971 Since the current mirror circuit 94 is turned on, the gate potential of the MOSFET 92 is a high level, which is lower than the power source voltage VB by an emitter-collector voltage of the PNP transistor 94*b*. The MOSFET 92 is thus in the off-state. The capacitor 93 is in the charged state.

When the PWM signal is changed to a high level, the current mirror circuit 94 is turned off. The gate potential of the MOSFET 92 is changed to a low level by operation of the current mirror circuit 95. In this operation, the capacitance C between the gate and the source of the MOSFET 92 including the capacitor 93 is charged at a CR time determined by a resistance of the resistor 96R. When the gate potential falls to the low level (finally a voltage corresponding to VF of the NPN transistor 95*a*), the MOSFET 92 is turned on to supply a current to the light 2.

When the PWM signal is changed to the low level from this state, the current mirror circuit 94 is turned on. A current flows to the gate of the MOSFET 92 to raise the gate potential. The capacitance C between the gate and the source of the MOSFET 92 is discharged at the time constant CR. As described above, the same advantage as the first embodiment will be provided, even if the signal output circuit 91 of the thirteenth embodiment is configured to drive the light 2 at the high side.

(Fourteenth Embodiment)

A fourteenth embodiment is shown in FIGS. 29 and 30 and different from the sixth embodiment as follows.

A signal output circuit 111 according to the fourteenth embodiment has additional circuits in an integrated circuit (IC) 112. A series circuit of a current source 113 and a switch circuit 114, which are both minute charge current supply part, is connected between the output terminal of the booster circuit 4 and the gate of the MOSFET 1. A series circuit of a switch circuit 115 and a current source 116, which are both minute discharge current output part, is connected between the gate of the MOSFET 1 and the ground. The amount of current supplied from the current source 113 is set to be smaller than that supplied through the current source 6. The amount of current supplied from the current source 116 is set to be smaller than that supplied when the current mirror circuit 5 operates.

A logic circuit 117 is provided in place of the logic circuit 35. A comparator 118 is added to compare the source potential of the MOSFET 1 with a threshold voltage Vth3. In the fourteenth embodiment, a threshold voltage applied to a non-inverting input terminal of the comparator 23 is indicated as Vth2, a threshold voltage VB+Vref, which is determined by a voltage Vref applied to an inverting input terminal of the comparator 24, is indicated as Vth1. The relation among these three threshold voltages are Vth1>Vth2>Vth3. The signals applied to the logic circuit 117 from the comparators 24, 23 and 118 are indicated as IN1, IN2 and IN3. The logic circuit 117 controls on and off of the switch circuits 114, 34, 8 and 115 by control signals A, B, E and F, respectively. The logic circuit 117 further controls the rapid charge circuit 22C and the rapid discharge circuit 22D by control signals C and D, respectively. In this embodiment, the current source 113, the switch circuits 114, 115, the current source 116, the logic circuit 117 and the comparators 24 and 118 form current change mitigation part (control part).

The operation of the fourteenth embodiment is described below with reference to FIG. 30. In the initial state, in which the PWM signal is at the low level, only the control signals D and F are at the high level so that only the switch circuit 115 is turned on and the other switch circuits are turned off. The gate capacitance of the MOSFET 1 including the capacitor 9 is discharged by the current source 116 and the rapid discharge circuit 22D so that the gate potential is at the low level.

<Charge Time Operation>

When the PWM signal becomes high, the logic circuit 117 changes the control signal D to the low level to stop the operation of the rapid discharge circuit 22D. The logic circuit 117 also changes the control signal F to the low level to turn off the switch circuit 115. From this time point to a time point, at which the source potential Vs of the MOSFET 1 rises above the threshold voltage Vth2, the control signal A is changed to the high level to turn on the switch circuit 14. The capacitor 9 is thus charged by the current source 113. In this charge time, the MOSFET 1 turns on with its gate potential Vg rising to exceed the on-threshold voltage. The current Il supplied to the light 2 thus starts to flow very gradually.

When the source potential Vs exceeds the threshold voltage Vth2 with the input signal IN2 being at the high level, the logic circuit 117 changes the control signal B to the high level to turn on the switch circuit 34. The capacitor 9 is thus charged through the current source 6 (transistor 5*a* and resistor 6R). When the gate potential of the MOSFET 1 exceeds the threshold voltage Vth1 with the input signal IN1 being at the high level, the logic circuit 117 changes the control signals B and C to the low level and the high level, respectively, to operate the rapid charge circuit 22C and charge the gate capacitance of the MOSFET 1 rapidly.

<Discharge Time Operation>

When the PWM signal becomes low, the logic circuit 117 changes the control signal C to the low level to stop the operation of the rapid charge circuit 22C. From this time point to a time point, at which the source potential Vg of the MOSFET 1 falls below the threshold voltage Vth1, the control signal D is changed to the high level to operate the rapid discharge circuit 22D. The gate capacitance including the capacitor 9 is thus discharged rapidly by the rapid discharge circuit 22D.

When the gate potential Vg of the MOSFET 1 falls below the threshold voltage Vth1 with the input signal IN1 being at the low level, the logic circuit 117 changes the control signal D to the low level to stop the operation of the rapid discharge circuit 22D. The logic circuit 117 further changes the control signals B and E to the high level to discharge the gate capacitance including the capacitor 9 by the current mirror circuits 5 and 7. When the source potential Vs falls below the threshold voltage Vth2 with the input signal IN1 being at the low level, the control signals B and E are set to the low level and the control signal F is set to the high level. Then the switch circuit 115 is turned on to discharge gradually the gate capacitance by the current source 116. As a result, the change in the waveform becomes very gradual at the time of stopping supply of the current to the light 2. When the source potential falls below the threshold voltage Vth3 with the input signal IN3 being at the low level, the logic circuit sets the control signal D to the high level to operate the rapid discharge circuit 22D.

In FIG. 12A of the fifth embodiment and FIGS. 14A and 14B of the sixth embodiment, for example, the gate potential are shown as changing gradually in the rising start time and the falling end time. The gate potential is set to change more gradually than in the fifth and the sixth embodiments when the current sources 113 and 116 are operated in the fourteenth embodiment.

According to the fourteenth embodiment, the current change mitigation part 119 operates to mitigate the change of the current at the time of starting supply of the charge current to the gate of the MOSFET 1 and at the time of ending flow of the discharge current from the gate. Specifically, supply of the charge current is started through the current source of a smaller charge current from the state of stopping the operation of the current mirror circuit 5. The operation of the current mirror circuit 5 is stopped when the level of the source voltage Vs f the MOSFET 1 falls below the threshold value Vth2. Thus, the discharge current flows through the current source 116, which allows only a smaller discharge current. As a result, the current waveform is controlled to change gradually at the time of starting the current supply to the light 2 and at the time of ending the current supply to the light 2.

(Fifteenth Embodiment)

A fifteenth embodiment is shown in FIGS. 31 and 32 and different from the fourteenth embodiment as follows.

A signal output circuit 111A of the fifteenth embodiment is different only in that the non-inverting input terminal of the comparator 118 formed as an integrated circuit (IC) 112A is not connected to the source of the MOSFET 1 but is connected to the gate of the MOSFET 1. As shown in FIG. 32, the threshold voltage Vth2 is indicated on the gate potential Vg side. Other parts are similar to the fourteenth embodiment. The comparator 118 compares the gate potential Vg of the MOSFET 1 with the threshold voltage Vth2. However, since the source potential Vs changes in correspondence to the gate potential Vg because of the source follower configuration, the fifteenth embodiment operates in substantially the same way as the fourteenth embodiment. The fifteenth embodiment also provides the similar advantages as the fourteenth embodiment.

(Sixteenth Embodiment)

A sixteenth embodiment is shown in FIG. 33, which corresponds to FIG. 2, and is different from the first embodiment as follows.

A signal output circuit 121 has the following configuration as the control part in place of the current mirror circuit 7. A series circuit of a NPN transistor 122 and a resistor 123 (resistance R1) is connected between the MOSFET 1 and the ground. A base and an emitter of the NPN transistor 122 are connected to an output terminal and a non-inverting input terminal of an operational amplifier 124, respectively. The collector of the PNP transistor 5*b* is connected to the ground through a resistor 125 (resistance R2) and to a non-inverting input terminal of the operational amplifier 124.

The operation of the sixteenth embodiment is described below. It is assumed that a current ratio a between the PNP transistor 5*a* (collector current I1) and the PNP transistor 5*b* (collector current 12) is set to satisfy I1=α×I2. When the PWM signal is at the high level and the MOSFET 8T is turned on, the potential V+ at the non-inverting input terminal of the operational amplifier 124 is at a ground level and the NPN transistor 122 is turned off. When the PWM signal is at the low level and the MOSFET 8T is turned off, the potential V+ at the non-inverting input terminal of the operational amplifier 124 is at a level equal to R2×I2. Assuming that an emitter current of the NPN transistor 122 is 13, the current 13 is defines as I3=12×R2/R1 because R1×I3=R2×I2. By setting a resistance ratio R2/R1 to 2*a*, the following equation holds.

$$I3=2\ \alpha\times I2=2\ \alpha\times I1/\alpha=2\times I1$$

Therefore, the gate capacitance is discharged through the NPN transistor 122 by flowing a current, which is two times of the current I1 supplied from the current source 6. Thus, the same advantage as the first embodiment is provided.

The present invention is not limited to the embodiments described and shown above. The embodiments may be modified as follows.

The capacitor 9 may be eliminated. Although the waveform of rising and falling of the gate potential depends on an individual gate capacitance of each MOSFET 1, it is not so adversary if variations are not so influential. The electric load may be a motor or an LED, which is other than the light 2.

In the twelfth embodiment, the anode of the Zener diode 86 may be connected tot he ground, if the potential reference of the constant voltage circuit 84 need not be set to the drain voltage. In the thirteenth embodiment, one terminal of the capacitor 93 may be connected to the power source of the power source voltage VB without connection to the source of the MOSFET 92. Only the gate-source capacitance of the MOSFET 92 may be used without using the capacitor 93. In the fourteenth and the sixteenth embodiments, the rapid charge/discharge circuit 22 may be eliminated. The switch circuit 34 may be eliminated.

What is claimed is:

1. A signal output circuit for outputting a drive signal to a voltage-controlled switching element, which is connected in series with a load between a power source and a ground, in accordance with a control signal inputted thereto, the signal output circuit comprising:

a current generation circuit for generating a current in proportion to a potential difference between a potential at a control terminal of the switching element and either one of a voltage of a controlled power source and a ground potential;

a first current mirror circuit for supplying, as a mirror current, a current generated by the current generation circuit, the first current mirror circuit having a current path connected to the control terminal of the switching element; and a control part for controlling an operation of the charging and discharging of a capacitance component, which the switching element has between the control terminal and an output terminal connected to the load, in accordance with a level change of the control signal, wherein the control part includes an amplifier circuit, which has a transistor connected to the current path of the first current mirror circuit, and a switch circuit, which is configured to control an operation of the amplifier circuit in accordance with the level change of the control signal, wherein the switch circuit stops the operation of the amplifier circuit to thereby charge the capacitance component with a charge current supplied from the current mirror circuit, and wherein the switch circuit allows the operation of the amplifier circuit to supply a discharge current for discharging the capacitance component at a same current value as the charge current.

2. The signal output circuit according to claim 1, wherein:

the amplifier circuit includes a second current mirror circuit, which is formed of a pair of the transistors.

3. The signal output circuit according to claim 1, further comprising:

a capacitor connected between the control terminal and a common junction, to which the switching element and the load are connected.

4. The signal output circuit according to claim 3, wherein:

the capacitor has a capacitance greater than a capacitance component, which the switching element has between the control terminal and the load.

5. The signal output circuit according to claim 1, further comprising:

a charge/discharge assist circuit provided between the controlled power source and the control terminal and between the control terminal and the ground, the charge/discharge assist circuit being operable in a part of an operation interval and in a part of a stop interval of the amplifier circuit to form a bypass path for increasing a charge/discharge current relative to the control terminal.

6. The signal output circuit according to claim 5, wherein:

the charge/discharge assist circuit includes a comparator circuit, which compares, with a reference voltage set in accordance with a power source voltage of the power source, the potential at the control terminal of the switching element or the potential at the common junction between the switching element and the load; and the comparator circuit controls formation of the bypass path by an output signal thereof.

7. The signal output circuit according to claim 1, further comprising:

a switching circuit connecting and disconnecting the first current mirror circuit to and from the controlled power source.

8. The signal output circuit according to claim 1, wherein:

the switching element outputs the drive signal between the power source and the load.

9. The signal output circuit according to claim 8, wherein:

the controlled power source includes a booster circuit for boosting the power source voltage.

10. The signal output circuit according to claim 9, wherein:

the controlled power source includes a constant voltage circuit for stabilizing a voltage boosted by the booster circuit to a constant voltage.

11. The signal output circuit according to claim 1, wherein:

the current generation circuit is provided in a supply path of the controlled power source voltage of the controlled power source and includes a resistor, one end of which is connected to the control terminal.

12. The signal output circuit according to claim 1, wherein:

the control part includes a current change mitigation part for mitigating a current change at time points to start charging of the capacitance element and to end discharging of the capacitance element.

13. The signal output circuit according to claim 12, wherein:

the current change mitigation part starts supplying the charge current from a state that the operation of the first current mirror circuit is stopped through a minute current supply part, which supplies a minute current smaller than the charge current of the current generation circuit; and the current change mitigation part stops, when a level of a voltage outputted through the switching element falls below a threshold level, the operation of the amplifier circuit to flow the discharge current through a minute current flow part, which flows a minute current smaller than the discharge current of the amplifier circuit.

14. A signal output circuit for outputting a drive signal to a voltage-controlled switching element, which is connected in series with a load between a power source and a ground, in accordance with a control signal inputted thereto, the signal output circuit comprising:

a current generation circuit for generating a current based on a relation between a potential at a control terminal of the switching element and either one of a voltage of a controlled power source and a ground potential;

a first current mirror circuit for supplying, as a mirror current, a current generated by the current generation circuit; and a control part for controlling an operation of the first current mirror circuit in accordance with a level change of the control signal, wherein:

the control part operates the first current mirror circuit to supply a discharge current from the control terminal and stops an operation of the first current mirror circuit to supply a charge current to the control terminal;

the switching element outputs the drive signal between the power source and the load; and the controlled power source includes a booster circuit for boosting the power source voltage.

15. A signal output circuit for outputting a drive signal to a voltage-controlled switching element, which is connected in series with a load between a power source and a ground, in accordance with a control signal inputted thereto, the signal output circuit comprising:

a current generation circuit for generating a current based on a relation between a potential at a control terminal of the switching element and either one of a voltage of a controlled power source and a ground potential;

a first current mirror circuit for supplying, as a mirror current, a current generated by the current generation circuit; and a control part for controlling an operation of the first current mirror circuit in accordance with a level change of the control signal, wherein:

the control part operates the first current mirror circuit to supply a discharge current from the control terminal and stops an operation of the first current mirror circuit to supply a charge current to the control terminal; and the current generation circuit is provided in a supply path of the controlled power source voltage of the controlled power source and includes a resistor, one end of which is connected to the control terminal.

16. A signal output circuit for outputting a drive signal to a voltage-controlled switching element, which is connected in series with a load between a power source and a ground, in accordance with a control signal inputted thereto, the signal output circuit comprising:

a current generation circuit for generating a current based on a relation between a potential at a control terminal of the switching element and either one of a voltage of a controlled power source and a ground potential;

a first current mirror circuit for supplying, as a mirror current, a current generated by the current generation circuit; and a control part for controlling an operation of the first current mirror circuit in accordance with a level change of the control signal, wherein the control part operates the first current mirror circuit to supply a discharge current from the control terminal and stops an operation of the first current mirror circuit to supply a charge current to the control terminal, wherein:

the control part includes a current change mitigation part for mitigating a current change at time points to start supplying a charge current to the control terminal and to end flow of a discharge current from the control terminal;

the current change mitigation part starts supplying the charge current from a state that the operation of the first current mirror circuit is stopped through a minute current supply part, which supplies a minute current smaller than the charge current of the current generation circuit; and the current change mitigation part stops, when a level of a voltage outputted through the switching element falls below a threshold level, the operation of the first current mirror circuit to flow the discharge current through a minute current flow part, which flows a minute current smaller than the discharge current of the first current mirror circuit.

* * * * *